United States Patent [19]
Shimizu et al.

[11] 4,359,277
[45] Nov. 16, 1982

[54] CAMERA WITH PRINTED CIRCUIT BOARDS COMPRISING RESISTANCE-CONDUCTOR LAMINATED CONSTRUCTIONS

[75] Inventors: Masami Shimizu; Junji Omi, both of Tokyo; Kunio Watanabe, Kawasaki; Masanori Uchidoi, Yokohama; Hiroshi Aizawa, Kawasaki, all of Japan

[73] Assignee: Canon Kabushiki Kaisha, Tokyo, Japan

[21] Appl. No.: 171,329

[22] Filed: Jul. 23, 1980

Related U.S. Application Data

[63] Continuation of Ser. No. 898,147, Apr. 20, 1978, abandoned, which is a continuation of Ser. No. 795,609, May 10, 1977, abandoned.

[30] Foreign Application Priority Data

| May 24, 1976 | [JP] | Japan | 51-59894 |
| May 24, 1976 | [JP] | Japan | 51-59895 |
| Jul. 7, 1976 | [JP] | Japan | 51-80540 |
| Feb. 1, 1977 | [JP] | Japan | 52-10013 |

[51] Int. Cl.³ .................. G03B 17/00; H01C 10/16; H01C 1/012; H05K 1/12
[52] U.S. Cl. .................. 354/219; 354/202; 354/289; 354/354; 29/846; 338/127; 338/195; 338/202; 338/307; 361/409; 361/414; 339/17 B; 339/17 M

[58] Field of Search ............. 354/60R, 288, 289, 354, 354/155, 152, 202, 219, 56; 361/397, 398, 400, 401, 402, 408, 409, 412, 413, 414; 238/122–128, 195, 202, 307, 309; 29/832, 836, 841, 846; 339/17 R, 17 B, 17 M

[56] References Cited

U.S. PATENT DOCUMENTS

| 3,441,804 | 4/1969 | Klemmer | 361/402 |
| 3,670,639 | 6/1972 | Harnden, Jr. | 361/398 X |
| 3,846,805 | 11/1974 | Kiyohara et al. | 354/288 X |
| 3,872,356 | 3/1975 | Kruger et al. | 361/402 |
| 3,956,763 | 5/1976 | Yamanaka | 354/289 |
| 3,964,082 | 6/1976 | Mita | 354/289 |
| 3,979,763 | 9/1976 | Mills | 354/354 X |
| 4,032,881 | 6/1977 | Singleton | 338/174 X |
| 4,051,550 | 9/1977 | Seno et al. | 361/402 |
| 4,062,024 | 12/1977 | Tsunekawa et al. | 354/60 R |

OTHER PUBLICATIONS

"Printed Circuits and Allied Electronic Subassemblies," Photocircuits Corporation, Glen Cove, N.Y., 1954, pp. 4,6.

*Primary Examiner*—William B. Perkey
*Attorney, Agent, or Firm*—Toren, McGeady & Stanger

[57] ABSTRACT

The present invention relates to a camera with the main circuit boards and the sub-circuit boards comprising electrical circuit constructions having resistance-conductor laminated constructions so designed that the insulating support on which a resistance material layer and a conductor material layer are laminated are processed by means of selective etching. This is done in such a manner that the resistance members are constituted with the resistance material layer while the conductor parts such as wiring, terminals and so on are constituted with the conductor material layer.

21 Claims, 28 Drawing Figures

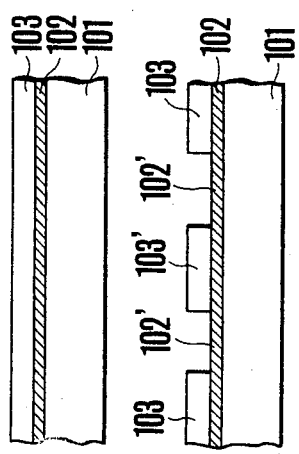
FIG. 2(a)
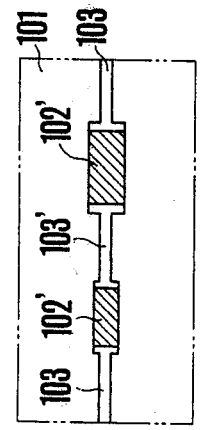
FIG. 2(b)
FIG. 2(c)
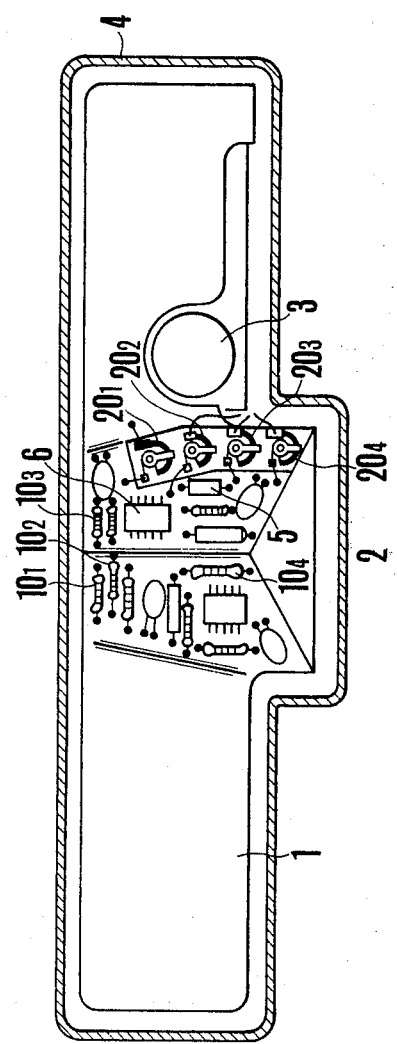
FIG. 1
(PRIOR ART)

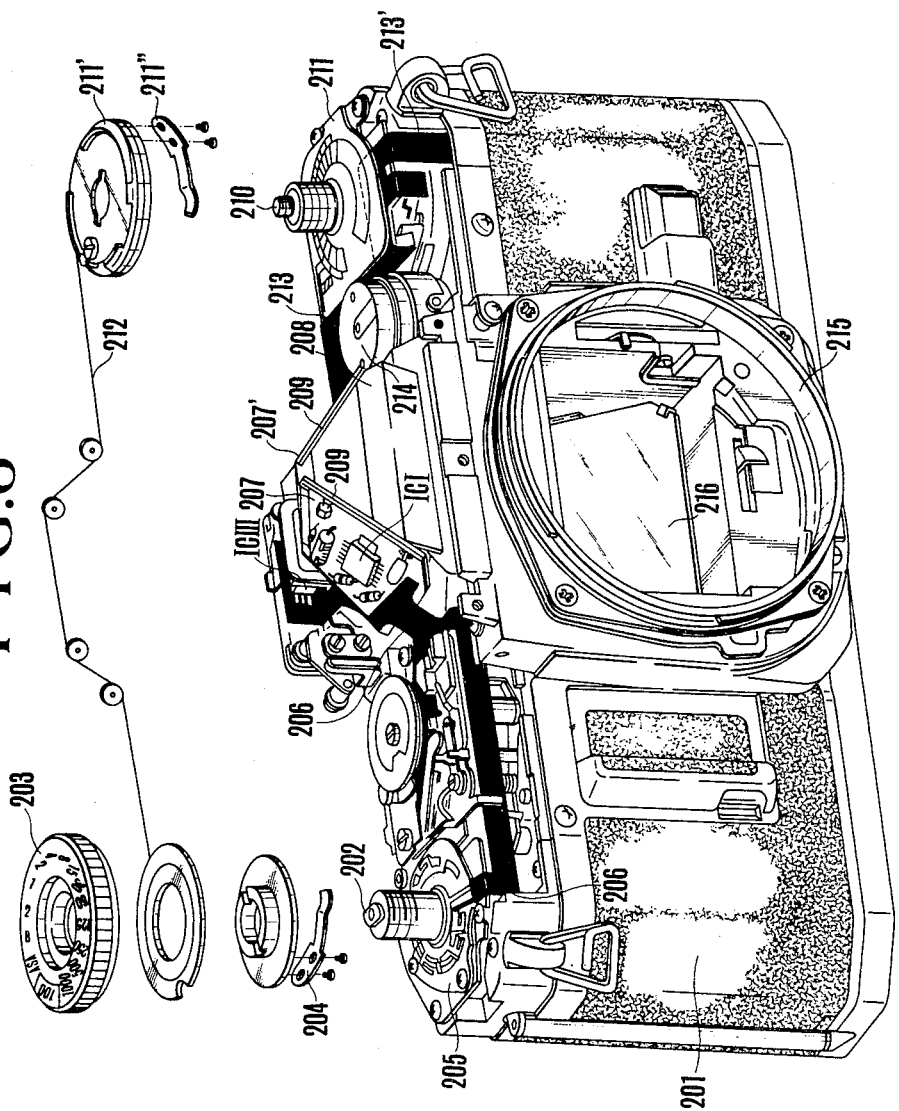

F I G.10a
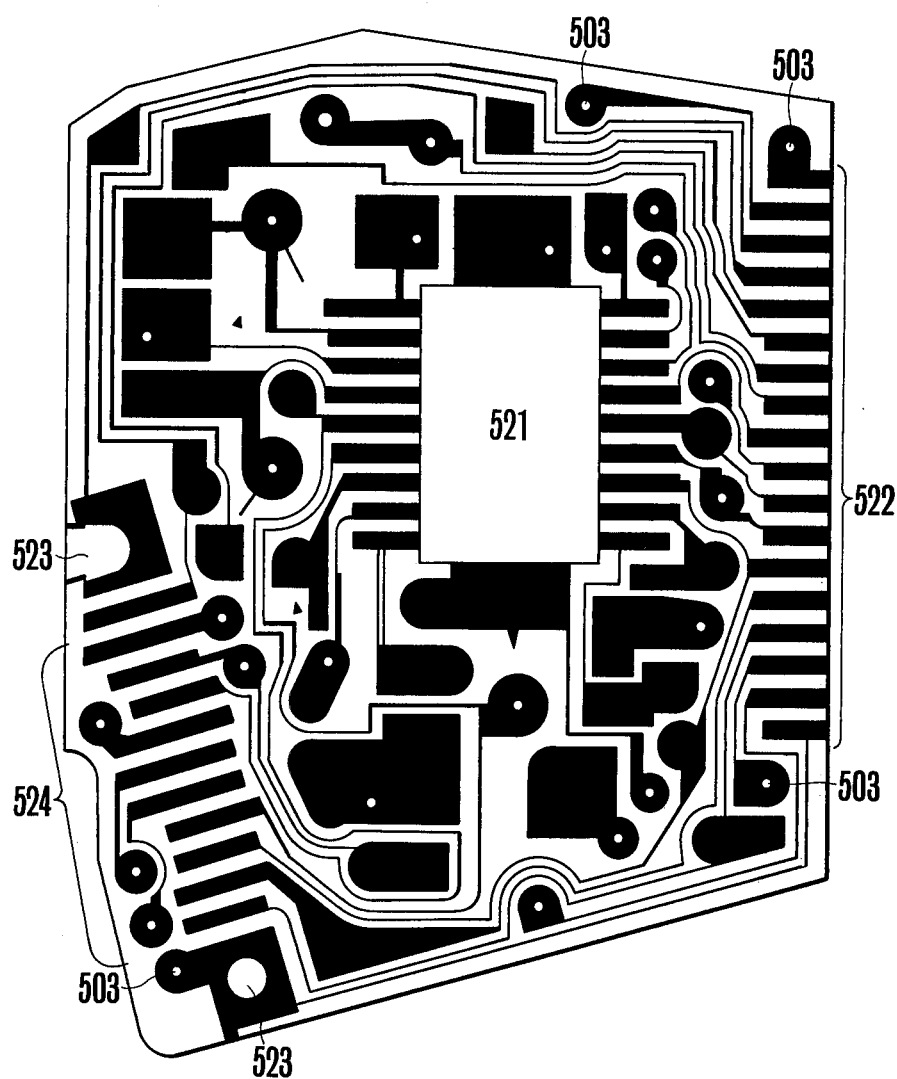

F I G.10b
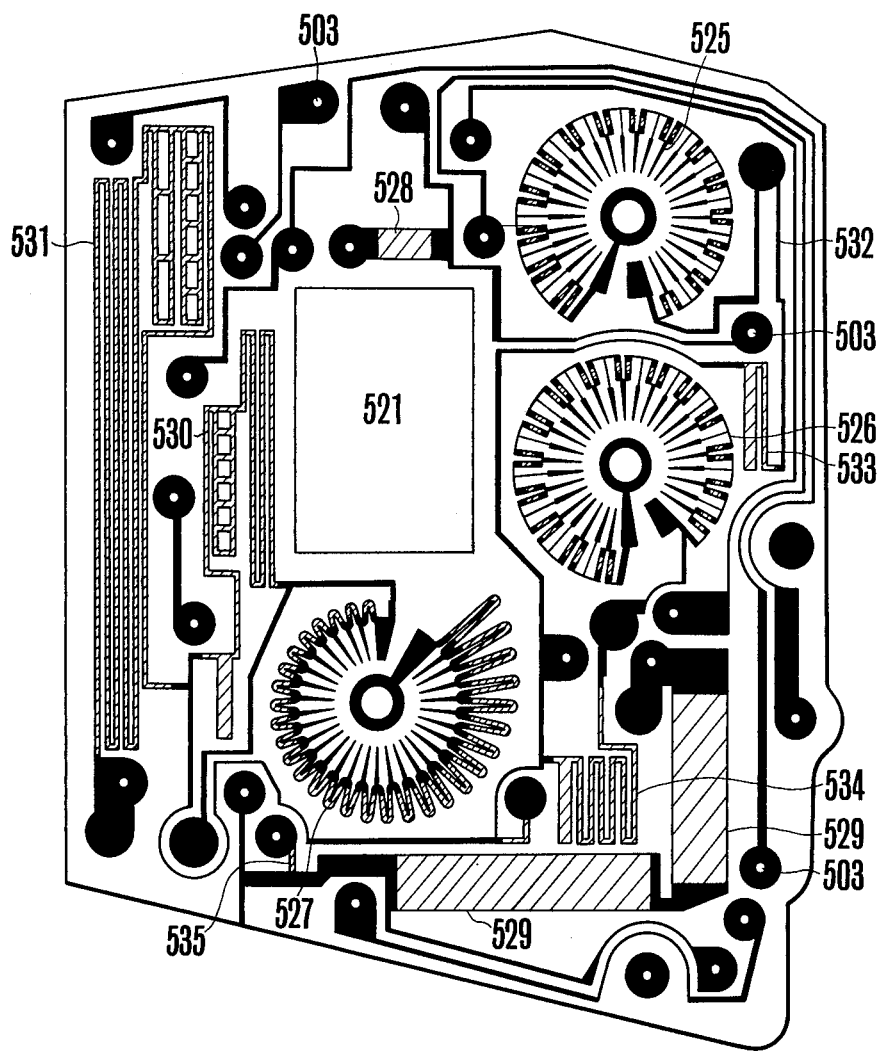

CAMERA WITH PRINTED CIRCUIT BOARDS COMPRISING RESISTANCE-CONDUCTOR LAMINATED CONSTRUCTIONS

This is a continuation of application Ser. No. 898,147, filed Apr. 20, 1978, now abandoned, which is a continuation of application Ser. No. 795,609, filed May 10, 1977 now abandoned.

BACKGROUND OF THE INVENTION

Until now, in order to constitute the electrical circuit constructions for controlling various operations of a camera, electrical members such as resistors and capacitors are arranged on the wiring boards on which patterns of conductor material are printed. Such members are connected to each other by means of the conductor patterns on the insulating support.

Recently, the camera has become much more automatic, the built-in electrical circuit has necessarily become much more complicated and the camera itself tends to become compact. Therefore, the space to be occupied with the electrical circuit constructions in the camera come to be limited. Accordingly, it has become difficult to satisfy the demand for the compactness and the high density with such conventional circuit constructions as mentioned above. In order to eliminate the above-mentioned difficulties, it has been proposed to obtain the desired compactness and high density by integrating the main parts of the electrical circuit constructions into IC or LSI. In this manner, the number of other external members such as resistors, capacitors and so on provided outside of IC or LSI constructions tends to become large. Thus, it is also difficult to arrange the electrical circuit constructions in the limited space in the camera and to make the external dimensions of the camera as small as possible. This creates a problem in camera design.

SUMMARY OF THE INVENTION

In order to eliminate the above-mentioned difficulty, the present invention proposes that the electrical circuit constructions to be built in a camera be made as thin as possible by using the electrical circuit boards comprising the lamination of the resistance material layer and the conductor material layer, and to connect the electrical circuit constructions to each other by means of the flexible printed wiring circuit, and to arrange IC or LSI on the main circuit boards which is the main part of the electrical circuit construction to be provided along the roof planes of the pentagonal prism.

BRIEF DESCRIPTION OF THE DRAWINGS

FIG. 1 shows the conventional electrical circuit for a camera in plan view.

FIG. 2 shows the construction of the resistor-conductor laminated circuit boards to be used for a camera in accordance with the present invention in sectional and plan views.

FIG. 6 shows an embodiment of the camera in accordance with the present invention in perspective view.

FIGS. 9a, 9b, 10a, and 10b respectively, show the pattern on the upper surface and the lower surface of the main circuit board used in the camera in accordance with the present invention.

DETAILED DESCRIPTION OF THE PREFERRED EMBODIMENT

Figure 3:
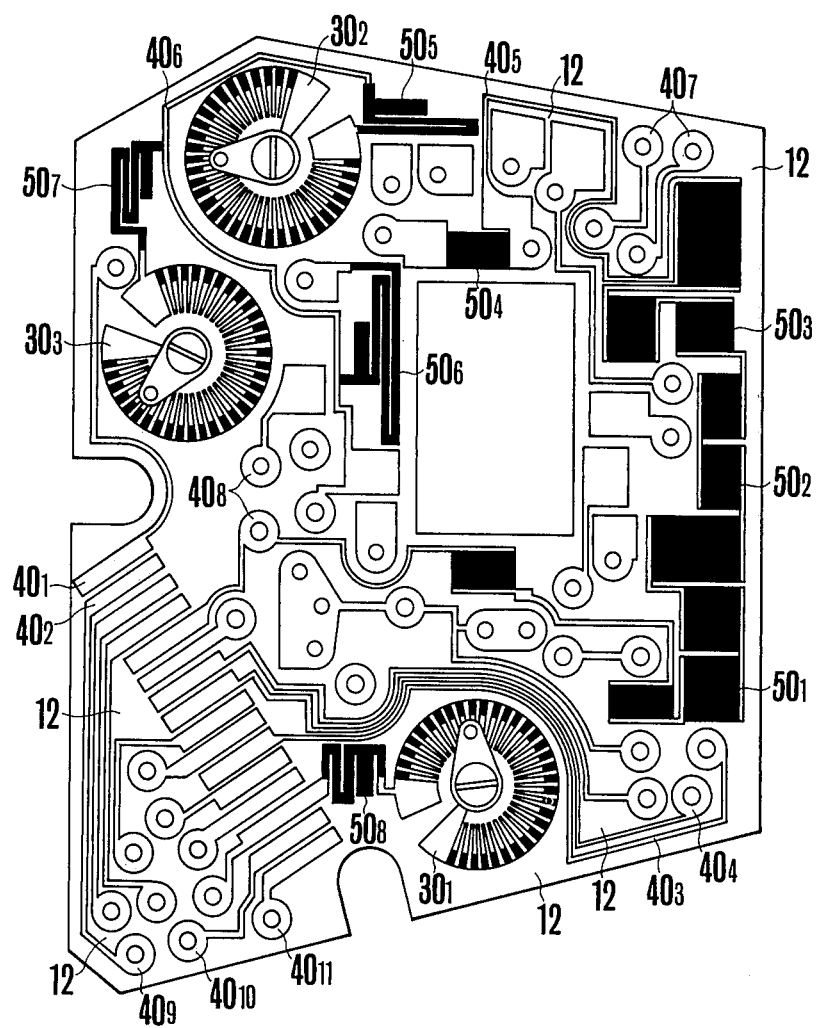
FIG. 3 shows a pattern of an embodiment of the circuit base plate for a camera, comprising the resistor-conductor laminated circuit boards shown in FIG. 2.
Figure 4A:
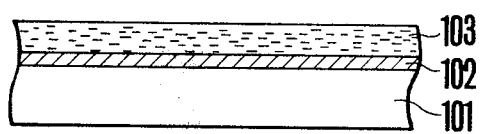
FIGS. 4 and 5, respectively, show how to obtain even surfaces of the resistor-conductor-laminated circuit boards shown in FIG. 2.
Figure 4B:
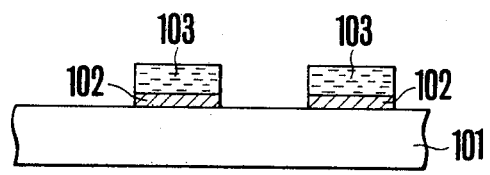
Figure 4C:
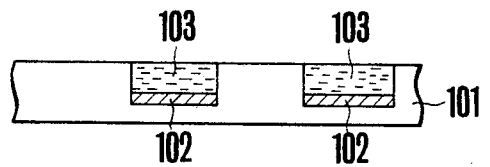
Figure 4D:
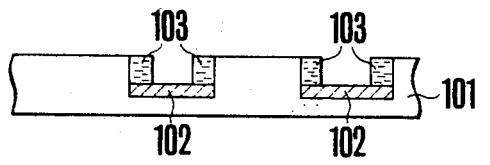
Figure 5A:
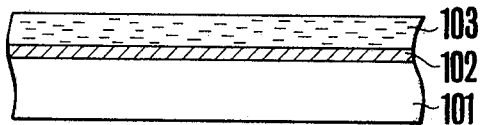
Figure 5B:
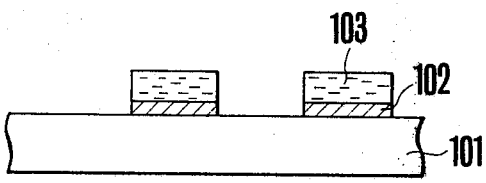
Figure 5C:
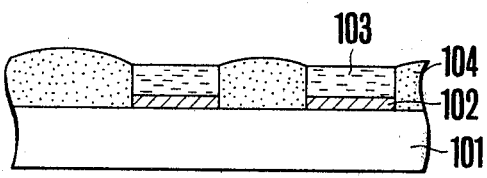
Figure 5D:
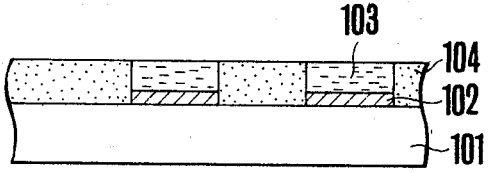
Figure 5E:
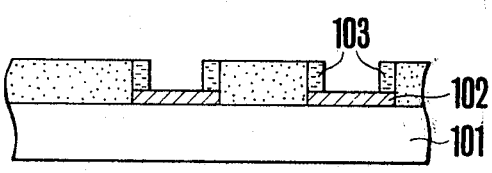

FIG. 1 shows the conventional electrical circuit construction arranged in the space between the pentagonal prism and the mechanical parts, and the upper cover, whereby 1 is the conventional flexible wiring circuit, 2 is the pentagonal prism, 3 is the display meter and 4 is the upper cover of the camera.

In the case of the conventional electrical circuit shown in FIG. 1, the resistance members $10_1$, $10_2$, $10_3$ and $10_4$ as well as the semi-fixed-type trimmer resistors for adjusting $20_1$, $20_2$, $20_3$ and $20_4$ are arranged on the flexible wiring circuit together with the capacitor 5, the coil member and semi-conductor element 6 so as to constitute the electrical circuit which is soldered on the pattern of the flexible wiring circuit. The number of the electrical circuit members to be arranged on the flexible wiring circuit 1 is limited. When a number of complicated circuits are needed for a complicated function, it is necessary to arrange the elements one over the other on the flexible wiring circuit. This is done in such a manner that the work for mounting the circuit elements on the flexible wiring circuit becomes complicated. Substantial space in the direction of the height of the flexible wiring circuit becomes necessary, so that mounting in the narrow space in the camera is difficult.

FIG. 2 shows the construction of the resistor-conductor-laminated circuit board to be used in the camera in accordance with the present invention in sectional and plan views. In the drawing, 101 is the insulating support consisting, for example, of glass, epoxy and so on. 102 is the resistance material layer constituted on the insulating support consisting of material such as nickel, phospher and so on. 103 is the conductor material layer on the 102, consisting of thin copper sheet. For the resistor-conductor-laminated board as mentioned above, the board sold under the trade name "Mica Ply Omega" by the Mica Corporation, U.S.A. can be used. FIG. 2(b) shows the laminated construction shown in FIG. 2(a), whereby the conductor material layer on the upper surface of the resistance material layer is partially eliminated by means of the selective etching so as to constitute the resistance parts and the conductive parts. 102' is the part where conductor material layer is removed by means of selective etching, leaving the resistance material lauer. Namely, the resistance material layer on this part makes up the resistance element. Parts 103 and 103', on which the conductor material layers remain, serve as terminals. The value of the resistance element is determined according to the length, the width and so on of the resistance material layer shown in FIG. 2(c). Hereby, the parts 103 and 103' of the conductor material layer serve as the terminals. Thus, the desired pattern of the circuit board plate is formed.

FIG 3 shows the enlarged pattern of an example of the circuit board circuit members other than the semi-conductor elements, the capacitors and so on have been soldered on the board so as to form a circuit board with the same effect as that shown in FIG. 1 using the resistor-conductor-laminated construction shown in FIG. 2. In the drawing, the white patterns are the conductor material layer parts which remain by means of the subtraction process and the resistance material layer parts arranged on the lower surface; the black parts are the resistance material layer parts which remain on the insulating support; white circles in the white pattern are through-holes for electrical connection with conductance material layer on the back surface of the board. The white part other than the white patterns is the surface of the insulating support from which the conductor material layer as well as the resistance material layer parts are removed.

In the drawing, $30_1$, $30_2$ and $30_3$ are the semi-fixed-type trimmer resistors, each consisting of the radial resistance material layer parts as is shown in FIG. 3, the contact electrodes being represented in a white pattern which extend radially above the radial resistance material layer parts. The slide member is pivoted at the center. They can be used as the adjusting variable resistor by rotating the rotary slide member in such a manner that the slide member is situated at a corresponding position of the radial electrodes.

$40_1$, $40_2$, $40_3$, $40_4$, $40_5$ and $40_6$ represent the conductor material layer pattern formed on the insulation board.

On the lower surface of the conductor layer pattern, the same resistance layer pattern remains, whereby, for the actual circuit operation, only the conductor parts on the upper surface are used since the resistance layer parts have nothing to do with the actual circuit operation.

$40_7$–$40_{11}$ are the terminal parts of the conductor layer pattern, serving to connect other circuit members than the resistance such as semi-conductors like IC, transistor or capacitor.

On both ends of each black part $50_1$–$50_5$, except for the semi-fixed resistors $30_1$–$30_3$, the conductive layer pattern is provided so as to constitute the resistance layer for forming the fixed resistor together with the conductor pattern ends.

The conductor pattern is a laminated board constituted as mentioned above is determined after taking the parts for forming the fixed resistor or the semi-fixed-type trimmer into consideration in advance. The other patterns of the resistance material of the electrical circuit elements can easily be realized by either a variable type or a fixed type only by repeating the chemical subtraction process in such a manner that the direct mounting of the resistor on the laminated boards can be made in a remarkably simple way. Thus, a compact circuit with many functions can be made in a simple way so as to be mounted in a small space of an especially compact camera. FIG. 3 shows the resistor-conductor laminated board immediately before mounting other circuit elements such as an IC, transistors and so on, whereby the pattern of the conductor layer is exposed on the surface so that it is possible to solder these circuit elements on the laminated board in the same way as in the case of the conventional circuit board. When thin electrical members are used, an extremely thin circuit board can be obtained.

For the laminated board of the embodiment shown in FIG. 3, the plate laminated on both surfaces can be used, whereby the patterns of the resistance layer parts and the conductive layer parts are formed so that the patterns on the one surface and those on another surface are electrically connected to each other by means of metallized holes.

The above-mentioned resistor-conductor-laminated board can obtain a higher density than the conventional laminated plate with printed resistor.

When the density of the conventional laminated plate with printed resistor is compared with that of the resistor-conductor-laminated board in accordance with the present invention, the conventional laminated plate consists of a laminated plate on which the resistance layer parts are printed whereby the limit of the width of the pattern is 0.5 mm. It is possible to narrow the width of the pattern of the resistance layer of the resistor-conductor-laminated board in accordance with the present invention down to 0.1 mm by means of etching the resistance layer parts and the conductor layer parts so as to obtain a remarkable high density in the composition of the resistance members and other electrical circuit members of the resistor-conductor-laminated board. Further, it is possible to make the width of the pattern of the resistance layer part several times as small as that of the conventional circuit so that it is possible to optionally form the size of the semi-fixed-type trimmer resistor such as 30₁, 30₂ and 30₃ shown in FIG. 3.

FIG. 4 shows a method for obtaining an even surface of the resistor-conductor-laminated construction shown in FIG. 2, whereby the method is called the flash method. By means of the flash method shown in FIG. 4, the board construction with the profile shown in FIG. 4(a) is processed into the construction shown in FIG. 4(b) by means of selective etching, leaving necessary patterns of the conductor as well as the resistor remaining. Then, by means of the flash method such as heat treatment, the construction of FIG. 4(b) is processed into the construction as is shown in FIG. 4(c), by pushing the patterns of the remaining conductor and the remaining resistor into the insulation base plate. Then the conductor layer on the part on which the resistance elements of the pattern are desired to be formed is removed by means of the selective etching after selective galvanizing so as to obtain a construction with the profile as shown in FIG. 4(d). Further, the coating such as insulation film is provided on the necessary part of the surface in case of necessity. On the resistor-conductor layer construction thus obtained, the desired resistance elements are constituted with the resistance layer of the construction in such a manner that the electrical circuit board with terminals and the wiring consisting of the conductor layer with desired patterns can be obtained whereby the surface becomes even. The resistor-conductor-laminated construction may be formed by means of processing not only the one surface but also another surface of the insulation board in the same way, whereby it is possible to form the circuit board by electrically connecting the patterns on the one surface and those on another surface to each other by means of the through-holes and so on.

FIG. 5 shows another method for evening the above-mentioned construction, whereby it is called the resin filling method. In the case of this method, the concave parts after the process shown in FIG. 5(b) are filled with resin during the process shown in FIG. 5(c), then the surface is polished into an even one as shown in FIG. 5(d) and formed by means of selective galvanizing and etching the conductor layer on the part to be used as resistance elements into circuit board as is shown in FIG. 5(e). It is also possible to selectively galvanize during the process shown in FIG. 5(a) or (b).

The example of the circuit board formed by means of the above-mentioned method and used in a camera will be explained later.

FIG. 6 shows the main members of an embodiment of the camera in accordance with the present invention in perspective view, whereby the upper cover of the camera body is removed. In the drawing, 201 is the body of th TTL-AE-single lens reflex camera with priority on shutter time. 202 is the winding up shaft, with which the shutter dial 203 and the film sensitivity setting mechanism are provided coaxially. 204 is the slide member for the shutter time setting variable resistor to be rotated by means of the shutter dial, slidably rotating over the contacts of the variable resistance on the sub-circuit board 205, being provided coaxially with 202. 206 is the flexible wiring circuit for connecting the sub-circuit board 205 to the main circuit board 207. 207 and 207' are the main circuit board, each presenting an integrated circuit construction ICI and ICII, consisting of the aforementioned resistor-conductor-laminated construction and arranged along the roof plane of the pentagonal prism 208. On the main circuit board 207 and 207', the external members such as capacitors, transistors and so on are mounted beside the IC. ICIII is the integrated circuit construction of the light measuring circuit including a light sensing element such as a silicon photo cell (SPC), being connected to the main circuit board by means of the flexible wiring circuit 206. The integrated circuit construction IC is mounted in the rectangular hole part in the main board plate, shown in FIG. 3 as being connected to the terminal parts, while between the main circuit boards 207, 207' and the roof plane of the pentagonal prism, the insulation plate 209 is provided. 210 is the rewinding shaft, coaxially to which the film sensitivity and shutter speed setting variable resistor 211 is provided, whereby the slide members 211', 211" are connected to the film sensitivity setting mechanism coaxial with the shutter dial by means of the string 212 in such a manner that when the shutter dial is rotated in the pulled up state, the slide member moves sliding over the contacts of the aforementioned film sensitivity and shutter speed setting variable resistor so as to set the film sensitivity minus shutter speed. 213 is the flexible wiring circuit for connecting the sub-circuit board including the above-mentioned variable resistor 211 to the main circuit board 207, whereby to the one end 213' of this board (to the terminals 40₁, 40₂ shown in FIG. 3), another (not shown) sub-circuit board and so on are connected. Numeral 214 represents the display meter, 215 the lens mount and 216 the movable mirror.

Figure 7:
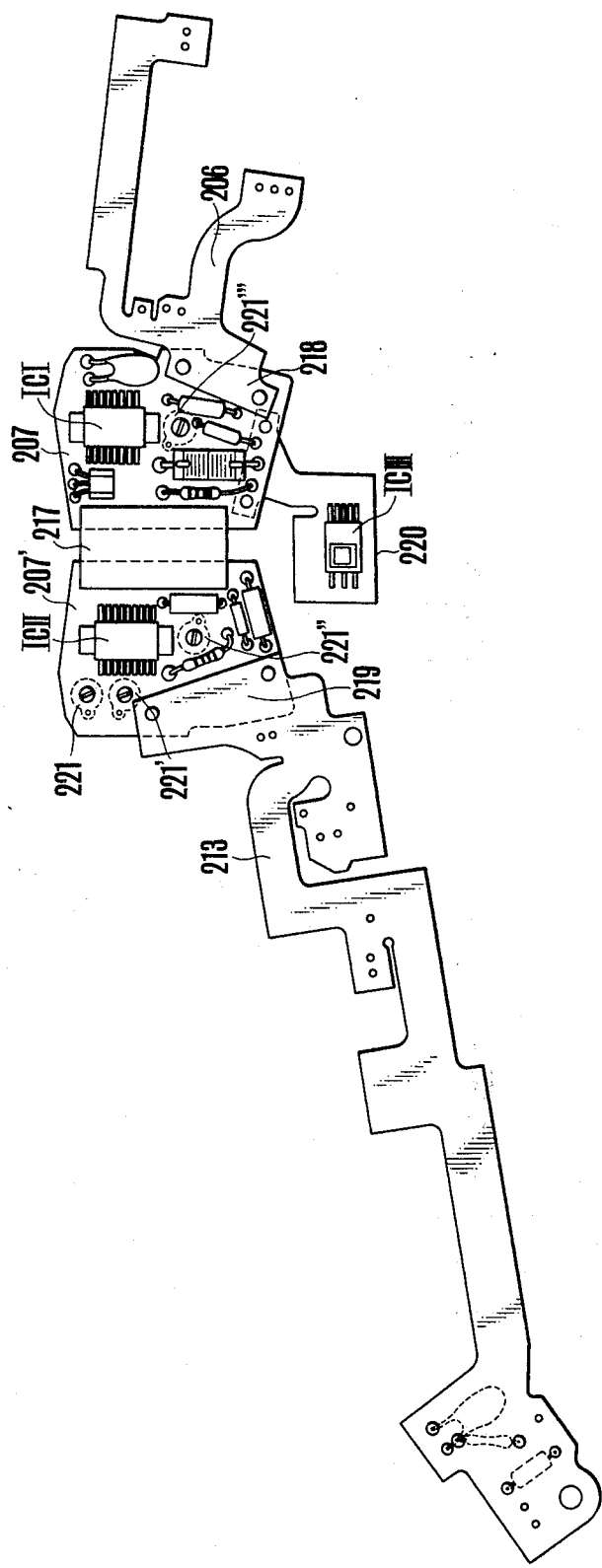
FIG. 7 shows an embodiment of the electrical circuit construction shown in FIG. 6 in development.

FIG. 7 shows the electrical circuit construction shown in FIG. 6 in development, whereby the same members as those in FIG. 6 use the same numerals. In the drawing, on the main circuit board 207 and 207', ICI and ICII are respectively provided, whereby these two main circuit boards are connected to each other by means of the flexible wiring circuit or the comb-tooth-shaped wiring member 217. Further, on the main circuit boards, the flexible wiring circuits 206 and 213 are provided through the terminal parts 218 and 219, whereby on the conductor terminal parts of the boards are electrically connected with the wiring circuit through soldering. The light measuring part 220 is provided with ICIII of the light measuring circuit including the light sensing element such as SPC, being connected to the main circuit board by means of the flexible wiring circuit. This light measuring part is arranged near the view finder window. On the main circuit board, the external members such as capacitors, resistors, transistors and so on shown in the drawing, as well as the adjusting shafts 221, 221', 221" and 221'" of the semi-fixed resistors to be arranged on the rear surface of the board are arranged in such a manner that the semi-fixed resistors are adjustable from the front surface of the board by means of a screw driver or the like. The IC to be mounted on the main circuit board is put in the rectangular hole in the board, whereby the terminals of the IC are soldered on the terminal parts provided on the front surface of the board. The main circuit board constituted as mentioned above is arranged along the roof plane of the pentagonal prism of the camera as shown in FIG. 6, whereby the flexible wiring circuit connecting the two boards is arranged so as to bridge the roof planes over the upper side of the prism. Although not shown in FIG. 7, the sub-circuit board including information setting variable resistor and others are connected to the respective terminal parts of the flexible wiring circuit 206, 213 so as to constitute an electrical circuit construction to be mounted in the camera.

Figure 8:
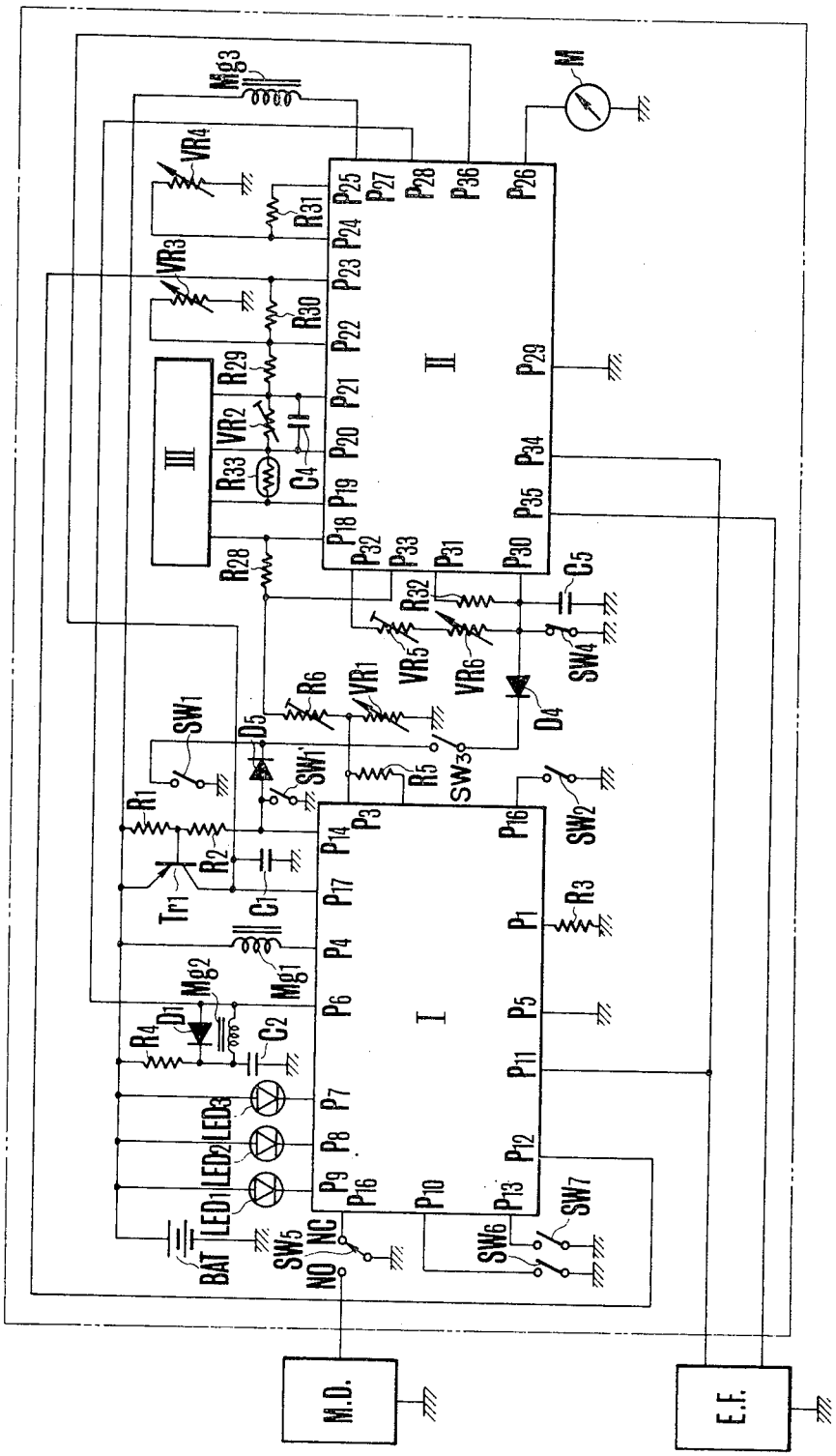
FIG. 8 shows an embodiment of the electrical circuit of the camera in accordance with the present invention.

FIG. 8 shows an embodiment of the electrical circuit in the camera in accordance with the present invention. In the drawing, an AE camera with priority on shutter time is shown, whereby I and II are the integrated circuit construction, while III is the integrated circuit construction of the light measuring part. The part in a chained line in the drawing is the electrical circuit built in the camera body, whereby MD is the motor drive device while EF is the automatic light adjusting flash device. MD and EF are used, mounted accordingly on the camera. The electrical members around ICI and ICII are the external members on the main circuit boards or the independent members provided as resistor-conductor-laminated construction in accordance with the present invention, whereby out of them the resistor elements R and most of the semi-fixed resistor are constituted as aforementioned laminated construction, making one body with the boards. The light measuring circuit III consists of the light sensing element SPC with quick light sensing property, the operational amplifier for logarithmically amplifying the photoelectrical output and so on so as to produce a signal corresponding to the object brightness to be applied to ICII. II is an IC including the operation part, the time control part and the display part, M the display meter, $M_{g3}$ the shutter time control magnet, $VR_3$ the shutter time and film sensitivity information setting variable resistor, $VR_4$ the smallest aperture value Ao setting variable resistor and $VR_6$ the time setting variable resistor in functional engagement with the shutter dial, whereby they are arranged at the corresponding positions in the camera as a sub-circuit board. The semi-fixed-type trimmer $VR_2$ serves to adjust the circuit for eliminating a quick fluctuation of the measured light value due to the flickering of the light source for illuminating the object, while $VR_5$ is the time adjusting resistor for the high speed shutter. $C_5$ is the capacitor of the time constant circuit for the shutter time control and $R_{33}$ the temperature compensation resistor, whereby the independent members out of them are mounted on the main circuit board 207' as external members. IC of I includes the sequence control part, the automatic exposure control part and the display lamp driving part, whereby the terminals $P_1-P_{36}$ of I, II and III are respectively connected to the IC connecting terminals on the main circuit boards. $LED_1$, $LED_2$ and $LED_3$ arranged around ICI are respectively the low brightness alarm display diode, the manual display diode and the self-timer display diode. $Tr_1$ is the transistor of the current supply holding circuit, $Mg_1$ the automatic exposure control magnet, $Mg_2$ the release operation control magnet and $VR_1$ the vignetting compensation information AC input variable resistor. The resistors as well as the semi-fixed-type trimmer resistors $R_1-R_6$ around ICI consist of a resistance layer of the main circuit board 207' so as to constitute the board construction provided with ICI and other independent members. BAT is the battery. $SW_1$ is the switch to be closed with the first stroke of the shutter release operation, $SW_1'$ the switch for light measuring circuit, $SW_2$ the switch to be closed with the second stroke of the shutter release operation, $SW_3$ the switch to be closed at the time of the bulb exposure, $SW_4$ the time count switch to be opened when the shutter is started opening. $SW_5$ is the switch to be changed over to the NC side when the winding up operation has been finished while the motor drive device MD is used and to be changed over to the NO side when the rear shutter plane has run, $SW_6$ the A-M change over switch to be closed at the time of manual photography and $SW_7$ the switch to be closed at the time of self-timer photography. The detailed construction of the above-mentioned electrical circuits as well as their operations are explained in the patent application No. Sho 50-126559 by the present inventors so that explanation is omitted here.

Below, the main circuit boards as well as the sub-circuit boards consisting of resistor-conductor layer construction for constituting the electrical circuit of the camera in accordance with the present invention will be explained in detail.

Figure 9A:
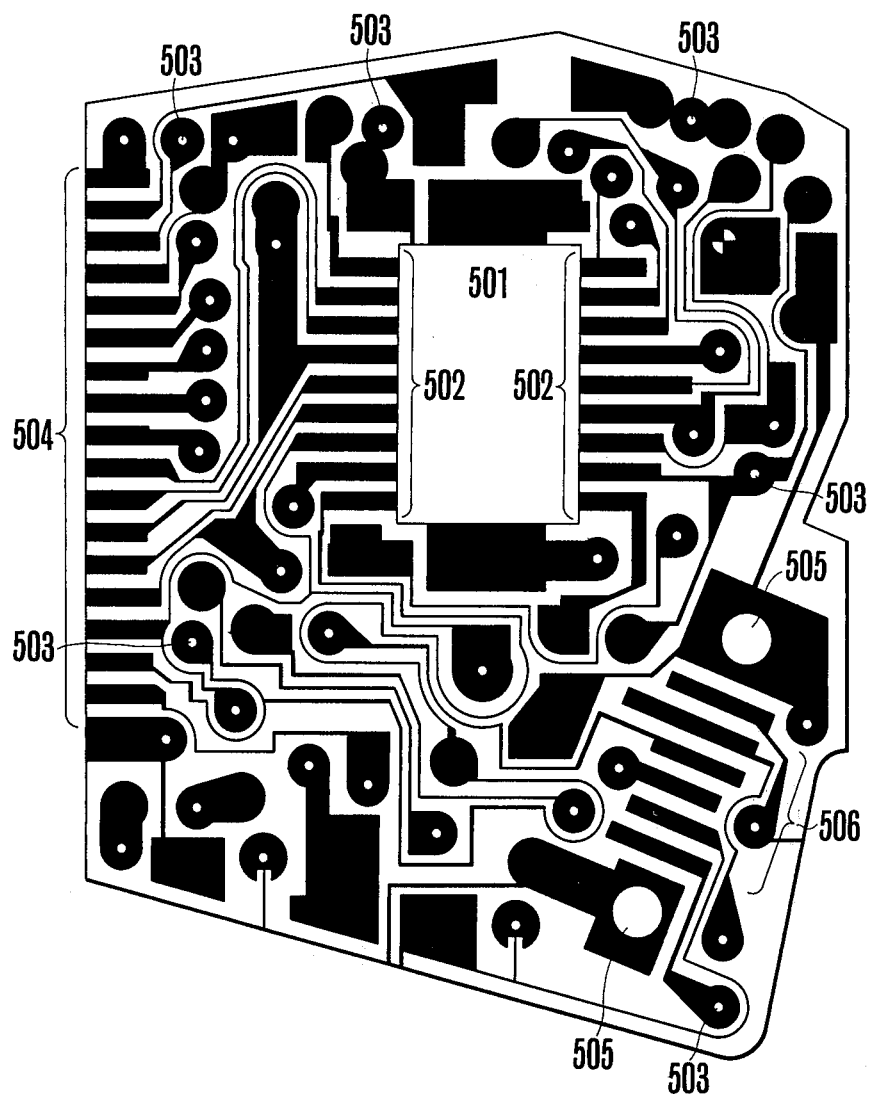
Figure 9B:
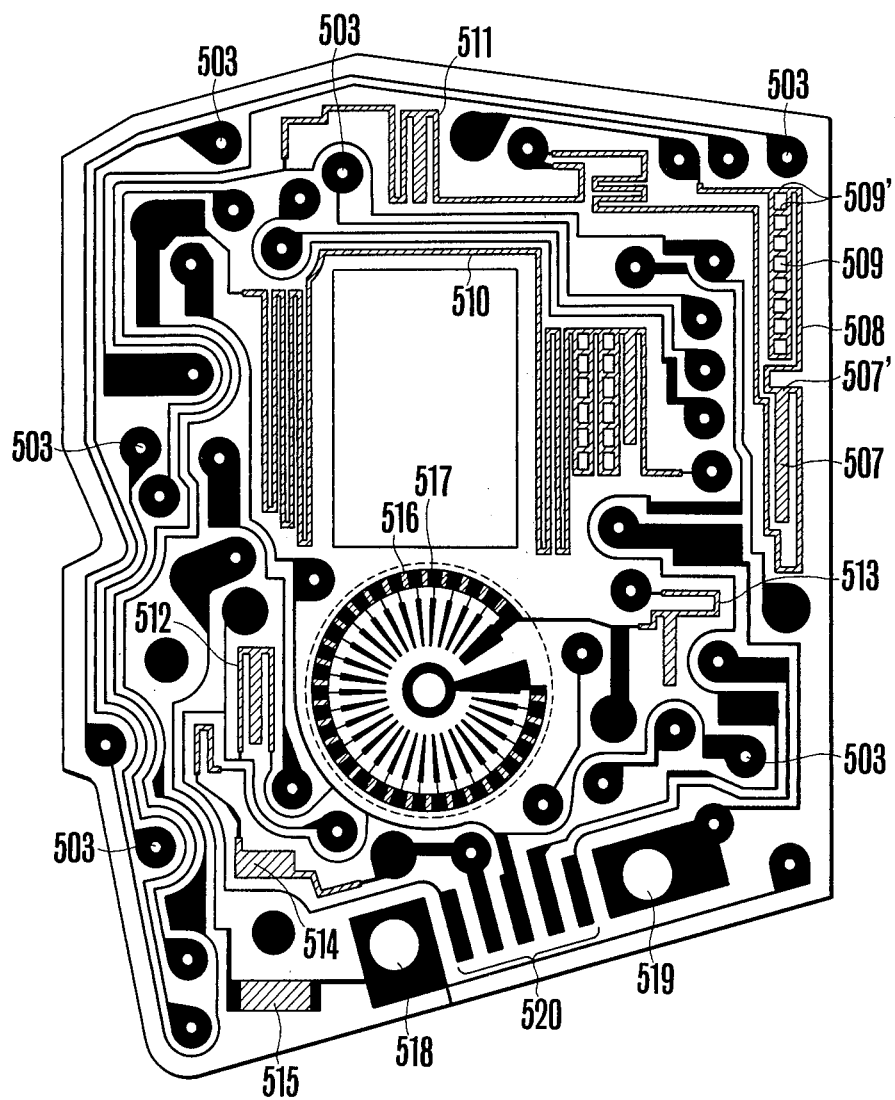

FIG. 9 shows the patterns on the front surface and the rear surface of the first main circuit board of the camera in accordance with the present invention, being arranged on the right roof plane shown in FIG. 6. FIG. 9(a) shows the pattern on the front surface of the board, whereby the black parts are the conductor parts consisting of conductor layer while other parts are the surfaces of the insulation support. The central rectangular part 501 in the drawing is the hole in which the IC is mounted. The IC is mounted in this hole in such a manner that its input terminals and its output terminals are soldered on the conductor terminal parts 502 around the hole. The black circles 503 are the terminal parts with a through-hole by means of which the patterns on the front surfaces are connected to the circuit of the patterns on the rear surface. Further, they are used for mounting the external member on the board. 504 are the terminals for connecting the first main circuit board to the second main circuit board in such a manner that the flexible wiring circuit or the comb-tooth-shaped wiring plate is mounted on these parts to connect the first main circuit to the second main circuit board. The white circles 505 are the holes by means of which the flexible wiring circuit is mounted on the main circuit board whereby the terminal parts of the wiring circuit board are soldered on the terminal parts 506. FIG. 9(b) shows the pattern on the rear surface of the first main circuit board shown in FIG. 9(a), whereby the pattern shown in FIG. 9(a) and that shown in FIG. 9(b) is constituted with resistor-conductor-laminated constructions on the front and the rear surface of one insulation support. The black parts in the drawing are the wiring, the terminals and the contact parts of the semi-fixed-type terminal resistors consisting of the conductance layer, while the hatched parts are the resistor elements consisting of the resistance layer. Further, the central rectangular part is the hole in which the IC is mounted. The black circles 503 are the through-holes facing the respective through-holes of the pattern on the front surface shown in FIG. 9(a) in such a manner that the terminals on the front surface and those on the rear surface are electrically connected to each other at these positions. The resistance values of the resistance elements of the pattern consisting of the resistance layer are determined by the length and width, whereby the values have to be finely adjusted after the resistor elements have been mounted on the board and therefore the trimming parts as shown in the drawing are provided on the resistor elements. The end 507' of the trimming part 507 shown in a comparatively wide solid line in the drawing is partially removed by laser light so as to adjust the resistance value in such a manner that the value of the resistor element 508 can be finely adjusted at a somewhat higher value. The resistance material of the ladder-shaped pattern 509 has its resistance value determined by correspondingly trimming the 509' with laser light.

The resistor element 510 presents two ladder-shaped trimming parts and one trimming part in a solid line, whereby the resistance value can be finely adjusted by correspondingly trimming them with laser light. Other resistance elements 512, 513 and so on also present the trimming parts in such a manner that the value of every resistor element can be adjusted after mounting circuit elements, the number of the semi-fixed resistor being decreased by this trimming. The resistor elements 514 and 515 do not present the trimming parts. The resistor elements 516 and the contact 517 constitute a semi-fixed-type trimmer resistor whereby there is provided at the center a hole in which the shaft of the slide brush is mounted. The pointed end of the brush mounted on the board through this hole moves slidingly over the contact 517 so as to operate as a variable resistor. The adjustment of the semi-fixed-type trimmer is carried out by rotating the shaft by means of a screwdriver or the like from the front surface of the board after mounting the circuit elements. The white circles 518, 519 are the holes for mounting the flexible wiring circuit, whereby the wiring terminals of the wiring circuit are soldered on the terminals of 520.

FIG. 10(*a*) shows the pattern on the front surface of the second main circuit board, being constituted in the same way as the first main circuit board shown in FIG. 9(*a*), whereby the black parts are the conductor parts consisting of conductor layer. The central rectangular part 521 is the hole in which the IC is mounted, whereby the conductors of the first main circuit board are connected to the terminal parts 522 on the side surface through the flexible wiring circuit on the comb-tooth-shaped wiring plate. 523 is the hole for mounting the flexible wiring circuit, whereby the conductors of the flexible wiring circuit are soldered on the terminal part 524. FIG. 10(*b*) shows the pattern of the resistor elements, the wiring, the terminals and the semi-fixed-type trimmer resistors consisting of resistor-conductor-laminated construction on the rear surface of FIG. 10(*a*), being connected to the conductor pattern on the front surface through the holes 503 so as to constitute a circuit. 525, 526 and 527 are the semi-fixed-type trimmer resistor, 528 and 529 the low resistor elements and 530–535 the resistor elements being constituted in accordance with FIG. 9. The central rectangular part 521 is the hole for mounting the IC. The semi-fixed-type resistor 527 has its resistance value inverted proportional to its angular placement (the $1/X$ characteristics), whereby the adjustment contacts are connected to each other with the resistor elements with different length (resistor value). 525 and 526 are the semi-fixed-type trimmer resistor with $1/X$ characteristics whereby the three contacts are connected to each other with two resistor elements. The distances between the adjacent contacts are made as small as possible so as to obtain as many contacts as possible in such a manner that the space occupied with the pattern is utilized effectively. At the center of these semi-fixed-type resistors, a hole for mounting the rotary shaft of the slide brush is provided in such a manner that the adjustment of the brush can be carried out by means of a screwdriver or the like from the front surface (FIG. 10(*a*)) of the board. Each resistor element has the trimming part as is explained in accordance with FIG. 9 in such a manner that the fine adjustment of the resistance value can be made by means of trimming with laser light after mounting circuit elements on the board.

Figure 11:
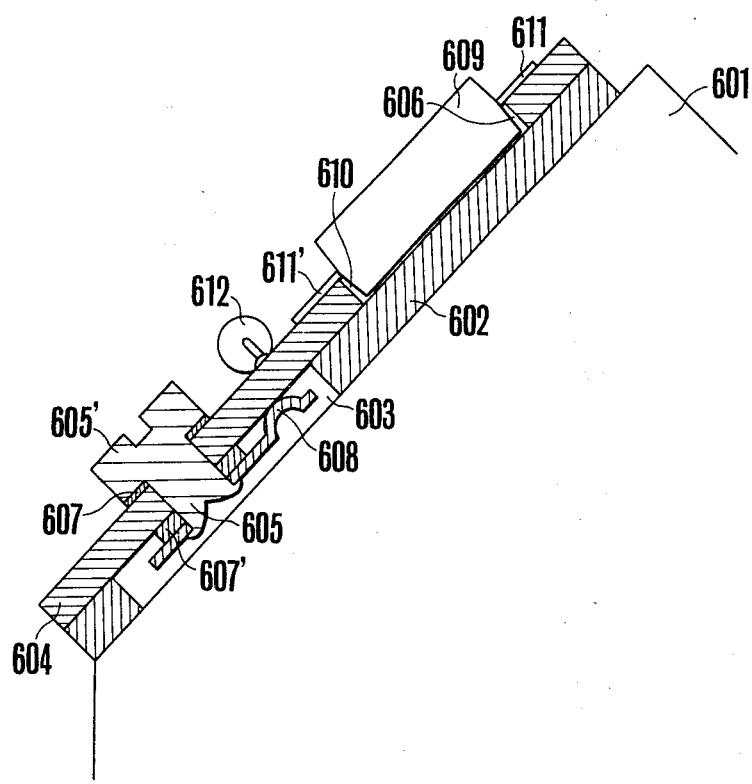
FIG. 11 shows the main circuit board shown in FIGS. 9 and 10, in section.

FIG. 11 shows the main circuit board of the camera in accordance with the present invention, being arranged on the roof plane of the pentagonal prism. In the drawing, 601 is the pentagonal prism, 602 the insulation plate arranged on the roof plane of the pentagonal prism and 603 the hole in which the part of the semi-fixed-type trimmer resistor is mounted. 604 is the main circuit board consisting of resistor-conductor-laminated construction, on the front surface of which board a conductor pattern shown in FIG. 9(*a*) is formed, and on the rear surface of which board the resistor and the conductor pattern shown in FIG. 9(*b*) are formed. 605 is the rotary shaft for adjusting the semi-fixed-type trimmer resistor, being provided with the screw head 605′ on the front surface and with the slide brush 608 on the rear surface in such a manner that the brush 608 moves slidingly over the contacts of the semi-fixed-type trimmer resistor. 607 and 607′ are the mounting spring washers. 609 is the integrated circuit construction (IC) to be mounted in the hole 610 in the board as shown in the drawing, whereby the terminal parts 611 and 611′ are soldered on the conductor terminals on the front surface. 612 is an external member such as a capacitor to be soldered on the terminal part on the front surface of the board. Further, the pattern on the front surface is electrically connected to that on the rear surface by means of the through-holes (not shown) so as to constitute an electrical circuit construction.

Figure 12:
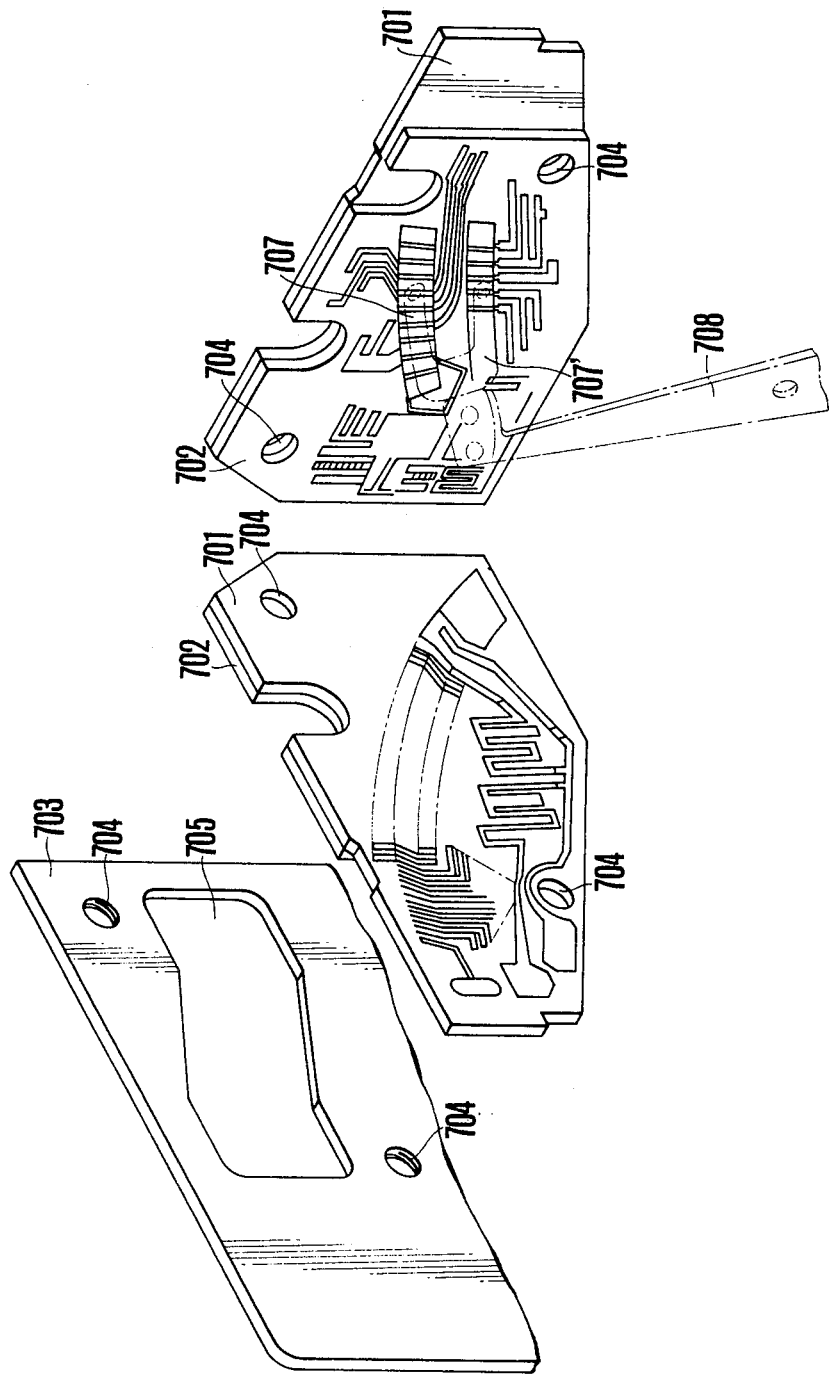
FIG. 12 shows an embodiment of the sub-circuit board for setting the smallest aperture value (Ao) of a taking lens and for setting compensating information (Ac) due to vignetting by the lens in one perspective view and of the sub-circuit board for the aperture value determination in another perspective view.

FIG. 12 shows an embodiment of the sub-circuit board for introducing the smallest aperture value information (Ao) and the vignetting information (Ac) into the circuit and of the sub-circuit board presenting the aperture value determining variable resistor in perspective view. In the drawing, 701 is the sub-circuit board presenting the aperture information setting variable resistor while 702 is the sub-circuit board presenting two variable resistors, respectively, for setting the smallest aperture value compensation information (Ao) and for setting the vignetting compensation information (Ac), whereby they are constituted with the resistor-conductor-laminated constructions in accordance with the present invention, being mounted on the member 703 together with the board 701 back to back. 704 is the mounting hole, while there is provided a hole 705 in which the slide member of the variable resistor of the board 702 is mounted, at the center of the member 703. On the front surface of the sub-circuit board 702, the resistor element consisting of the resistance layer and the contacts consisting of the conductance layer are provided as shown in the drawing in such a manner that the slide brushes 707 and 707′ move slidingly over the contacts. The brush is mounted on the pointed end of the brush lever 708 in functional engagement with the smallest aperture value pin of the taking lens. On the front surface of the sub-circuit board 701, the contacts, the wirings and the terminals consisting of conductance layer and the resistor elements consisting of resistance layer are provided in such a manner that the slide brush (not shown) moves slidingly over the contacts at high speed so as to determine the aperture value.

Figure 13:
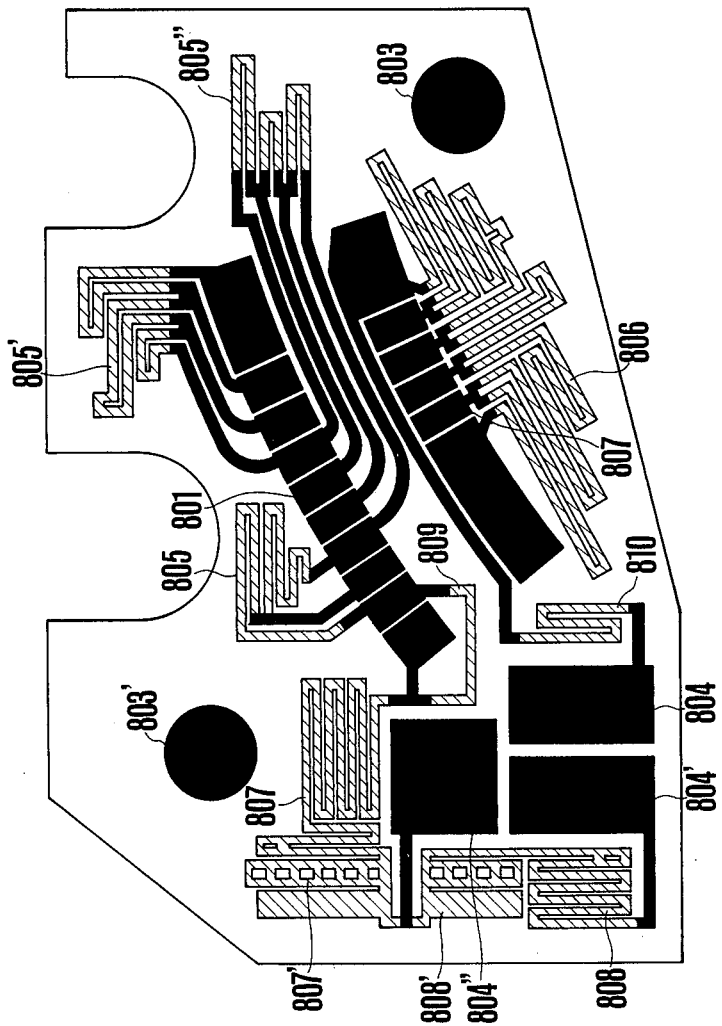
FIG. 13 shows the pattern of the sub-circuit board for setting Ao; Ac information shown in FIG. 12.
Figure 14:
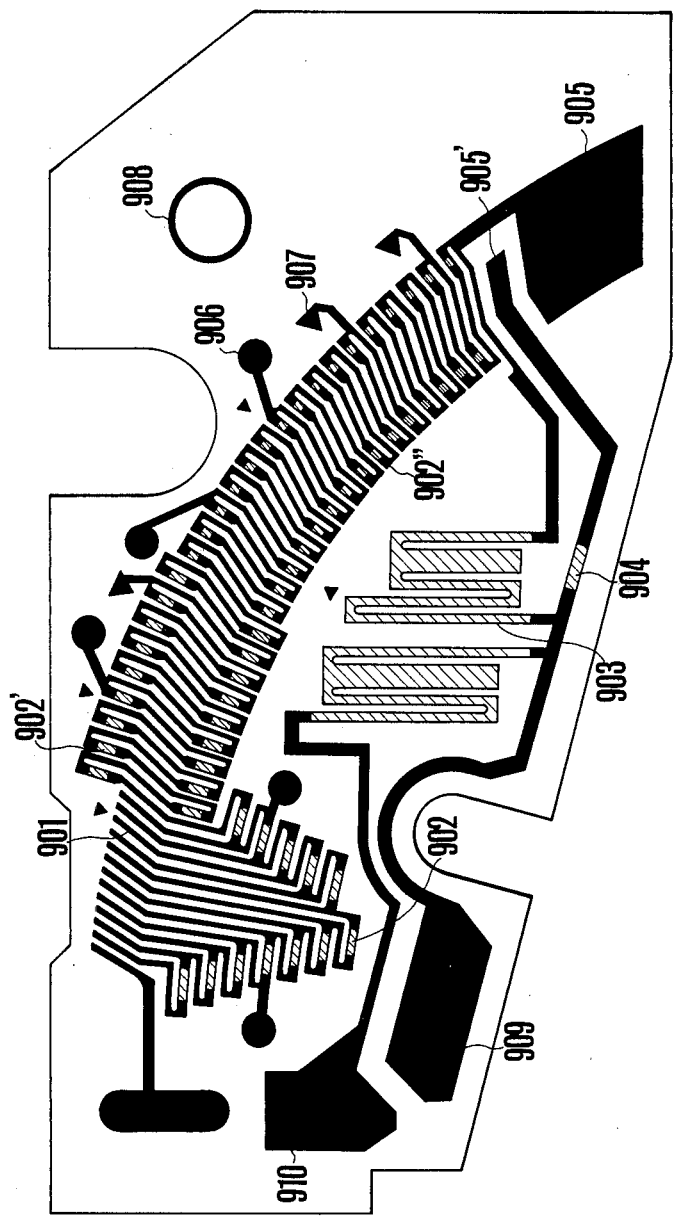
FIG. 14 shows the pattern of the sub-circuit board for aperture value determination shown in FIG. 12.

FIGS. 13 and 14, respectively, show a pattern of the sub-circuit board shown in FIG. 12. FIG. 13 shows the board consisting of resistor-conductor-laminated construction and presenting the variable resistor for setting the smallest aperture value compensation (Ao) information and the vignetting compensation (Ac) information. The black parts in the drawing are the conductor parts consisting of the conductance layer while the hatched parts are the resistor members consisting of the resistance layer. In the drawing, 801 are the contacts of the Ao setting variable resistor over which the slide brush as shown in FIG. 12 moves slidingly, so as to set Ac as well as Ac. 803 and 803' are the holes by means of which the board is mounted on the member 703, while 804, 804' and 804" are the terminals of the sub-circuit on which terminals the wire conductors are soldered for the output signal. 805, 805' and 805" are the resistor elements of the Ao setting variable resistor whose pattern allows the effective utilization of the space on the board and is arranged with the length corresponding to respective resistance value. 806 are the resistance elements of the Ac setting variable resistor, being accordingly bent as shown in the drawing and arranged so as to effectively utilize the space. The resistor elements 807 and 808 are provided with the ladder-shaped trimming part 807' and the solid line shaped trimming part 808'. The resistor elements 809 and 810 are not provided with any trimming parts. FIG. 14 shows the pattern of the sub-circuit board constituting the aperture determining variable resistor, being mounted on the member 703 together with the board shown in FIG. 3 back to back. In the drawing, 901 are the contacts of the variable resistor while 902, 902' and 902" are the resistor elements for connecting contacts to each other whereby they are formed with the resistance layer of resistor-conductor-laminated construction. The resistance value is chosen so as to present a hyperbolic ($1/\times$) characteristic curve, for example. 903 is the resistor element having the solid line shaped trimming part, being connected in series between one end of the variable resistor and the output terminal. The resistor element 904 and the terminals 905 and 905' belong to the circuit for determining the start position, from which position the slide member (not shown) moves slidingly over the contacts at high speed until it reaches the stopping position so as to determine the aperture value. The black circle 906 on the resistor element in the drawing is the checking terminal, while the triangle-shaped parts 907 are the mark patterns. Further, the while circle 908 is the mounting hole for the member 703 in FIG. 13.

Figure 15:
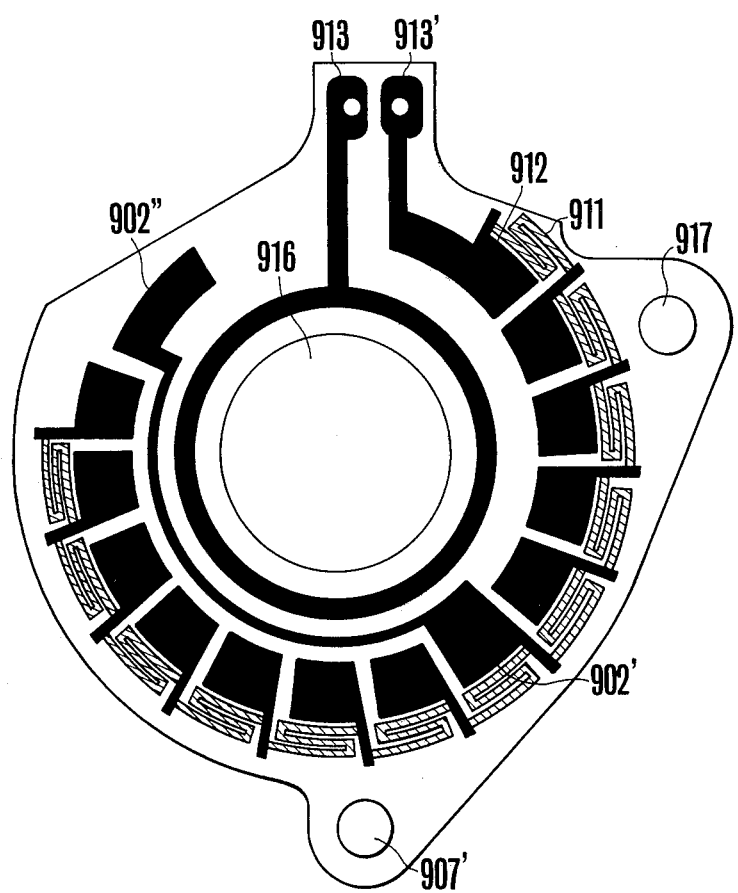
FIG. 15 shows the pattern of the sub-circuit board with the variable resistance material in functional engagement with the shutter dial of the camera in accordance with the present invention.
Figure 16A:
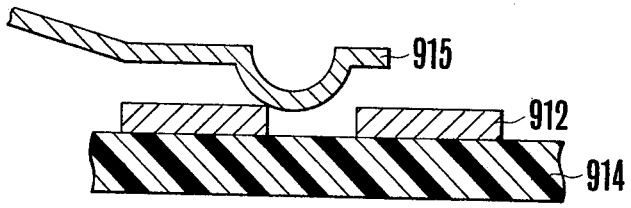
FIG. 16 shows the slidable contact member with the variable resistance material shown in FIG. 15, in section.
Figure 16B:
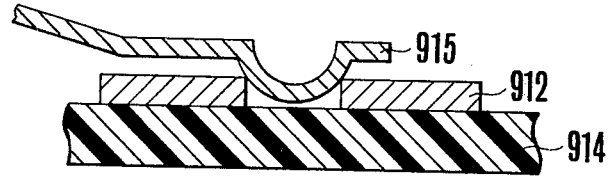
Figure 16C:
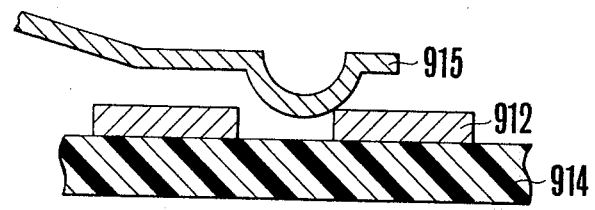

FIG. 15 shows the pattern of the sub-circuit board constituting the variable resistor in functional engagement with the shutter dial of the camera in accordance with the present invention. This is provided coaxially with the winding up mechanism shown in FIG. 6, whereby the brush of the slide member in functional engagement with the shutter dial moves slidingly over the contacts so as to determine the shutter time. The black parts in the drawing are the conductor parts consisting of the conductor layer, while the hatched parts are the resistor elements consisting of the resistance layer. 911 are the resistor elements of the various resistor, while 912 are contacts. 913 and 913' are the terminals of the variable resistances on which terminals the conductor wires of the flexible wiring circuit are soldered. The contact parts 912 of the sub-circuit board shown in FIG. 15 are provided higher than the insulation support 914 shown in FIG. 16, whereby the pointed end of the slide brush 915 moves slidingly, as shown in A, B and C, in such a manner that the brush stops at the position shown in B. In this way, the shutter dial carries out the click operation so that it is not necessary to provide a separate click mechanism in the case of the conventional device, while the precise stop position of the brush can be obtained. The circle 916 at the center in FIG. 15 is the hole for mounting the rotary shaft of the slide brush, while 917 and 917' are the holes for mounting the board. In accordance with the construction shown in the drawing, the time setting variable resistor can be remarkably thin.

Figure 17:
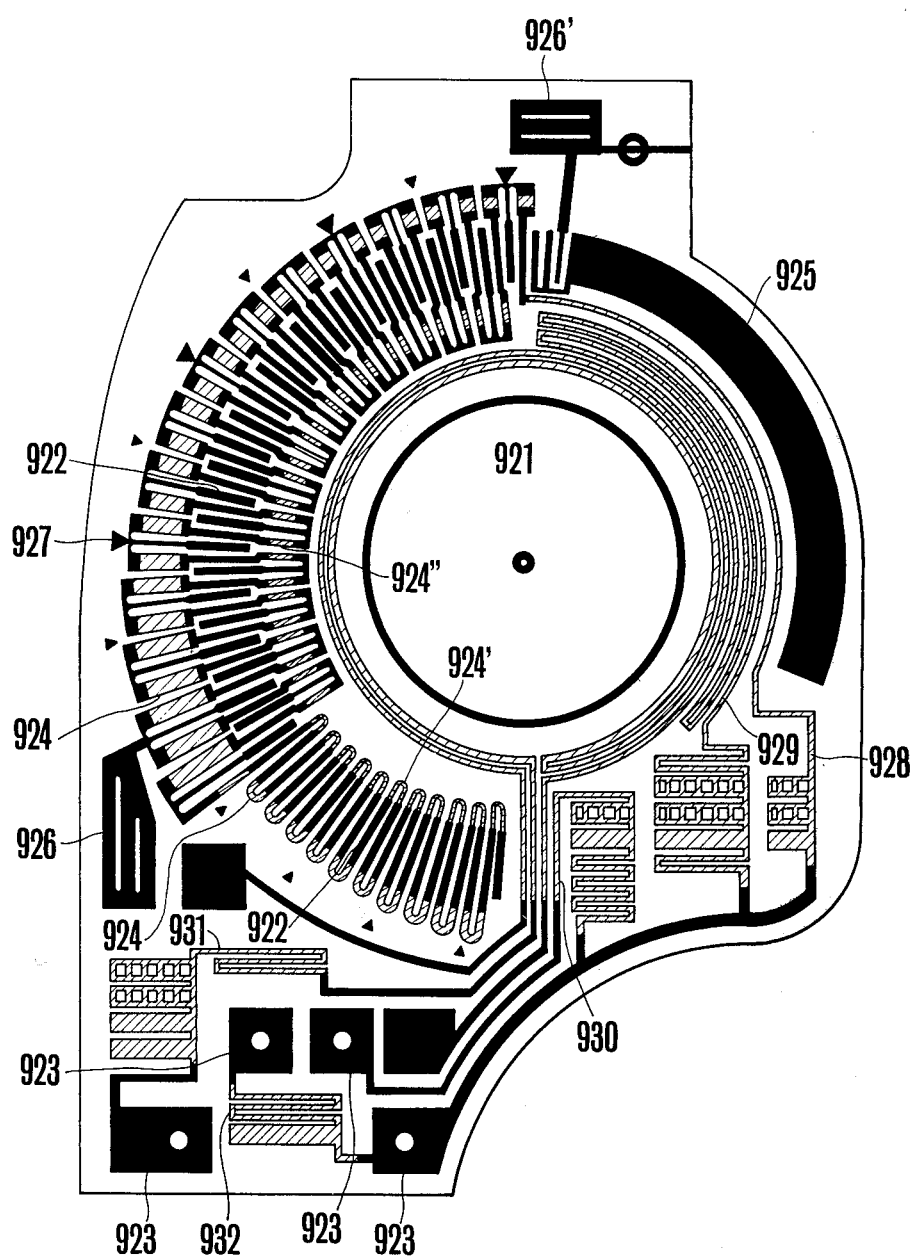
FIG. 17 shows the pattern of the sub-circuit board with the variable resistance material for setting the film sensitivity in functional engagement with the shutter dial of the camera in accordance with the present invention.

FIG. 17 shows the sub-circuit board having the film sensitivity setting variable resistor of the camera in accordance with the present invention; constituting the film sensitivity are shutter speed setting variable resistor together with the slide brush provided coaxially with the rewinding shaft in FIG. 6 and driven by means of the film sensitivity dial and the shutter dial. The black parts in the drawing are the conductor parts consisting of the conductor layer, while the hatched parts are the resistance elements consisting of resistance layer. The circle 921 at the center is the hole for mounting the rewinding shaft and the slide member, in which the rewinding shaft is provided as shown in FIG. 6. 922 are the contacts of the variable resistor, over which contacts the slide brush (not shown) moves slidingly so as to set the film sensitivity minus the shutter speed. 923 are the terminal parts on which the conductor wires of the flexible wiring circuit are respectively soldered. 924 are the resistance elements of the variable resistor; in the case of the part 924', each one resistance element is connected between the adjacent contacts in such a manner that they are arranged outside and inside of the contacts, while in the case of the part 924", each two resistance elements are arranged for three contacts in such a manner that they are arranged outside and inside of the contacts. In this way, the number of the contacts can be increased. This resistor also presents the $1/\times$ characteristics. The thick part 925 shown at the corner in the drawing is the non-operable range of the automatic exposure. 926 and 926' are the position-detecting electrodes at the time of mounting the brush, while part 927 are the marks. Other resistors than the resistance elements of the above-mentioned variable resistor are arranged in the space between the circle and the hole as shown in the drawing. The resistance elements 928, 929 and 930 and the resistance element 931 respectively present the ladder-shaped trimming part and the solid line shaped trimming part. Further, 932 is the resistance element provided between the terminals presenting the solid line shaped trimming part. These trimming parts are removed by means of the laser light so as to adjust the resistance value finely after the mounting of circuit elements on the board.

Figure 18:
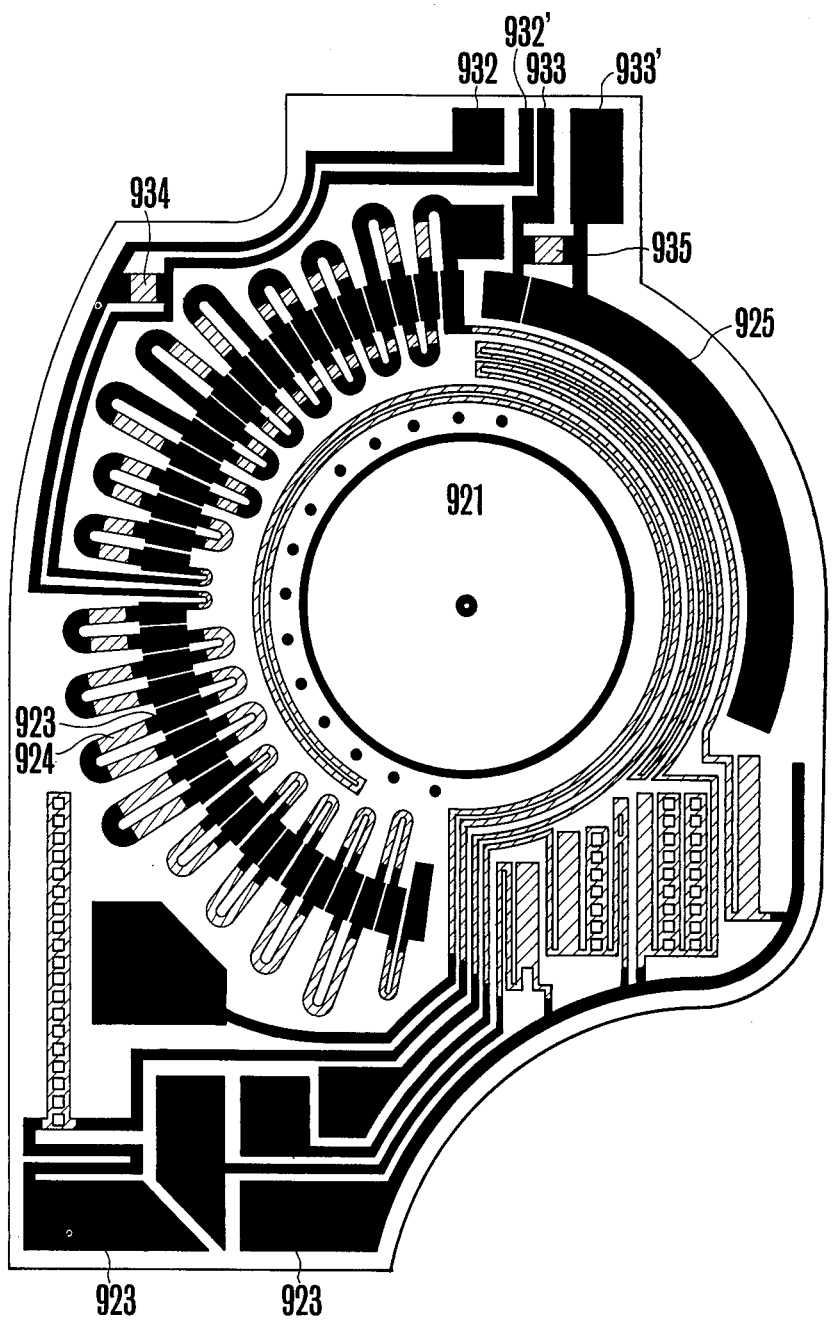
FIG. 18 shows the pattern of another embodiment of the sub-circuit board of the variable resistance material for setting the film sensitivity shown in FIG. 17.

FIG. 18 shows the pattern of another embodiment of the sub-circuit board having the film sensitivity and shutter time setting variable resistor shown in FIG. 17, whereby the number of the contacts is smaller than that in FIG. 17. In the drawing, the same elements as those in FIG. 17 present the same figures. Further, 932, 932', 933 and 933' are the brush mounting position-detecting electrodes, between which electrodes the low resistance elements 934 and 935 are provided in parallel. Other parts are similar to those of the embodiments shown in FIG. 17 so that their explanations are omitted here. An embodiment without the aforementioned parallel resistance elements 934 and 935 is also realizable. The values of the parallel resistors are chosen so as not to disturb the accuracy of the value of the variable resistor. When the position detecting terminals 932 and 932' (or 933 and 933') are short circuited by means of the brush, the short circuit signal is produced so as to detect the position of the brush.

Below, the method for connecting the main circuit board to each other and the circuit board to the flexible wiring circuit in the electrical circuit construction in accordance with the present invention shown in FIG. 6 and FIG. 7 will be explained in detail in accordance with an embodiment.

Figure 19:
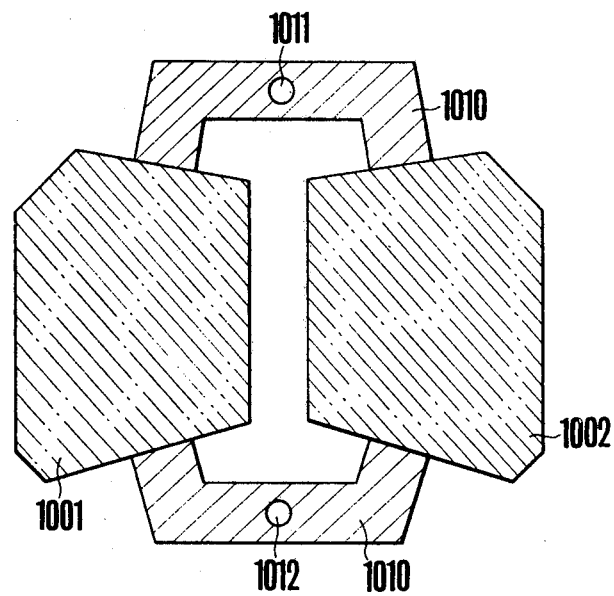
FIG. 19 shows an example of the arrangement of the two main circuit boards in plan view.

FIG. 19 shows an embodiment of the arrangement of the two main circuit boards. In the drawing, 1001 and 1002 are the main circuit boads, while 1010 is the mechanically connecting part, whereby 1011 and 1012 are the holes for the electrically connecting part.

Figure 20:
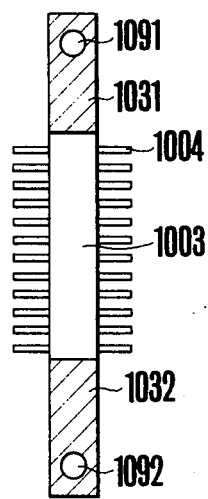
FIG. 20 shows the connector for electrically connecting the main circuit boards shown in FIG. 19 with each other.

FIG. 20 is the electrically connecting means, such as a connector for connecting the main circuit boards shown in FIG. 19, whereby 1003 is the connector body while 1004 are the electrical connector terminals. 1031 and 1032 are the prolongations of the connector body, 1091 and 1092 are the holes for the main circuit boards electrically connecting means, being provided at the positions corresponding to that of 1011 and 1012.

By setting the holes 1091 and 1092 of the connector shown in FIG. 20 in coincidence with the holes 1011 and 1012 of the main circuit board shown in FIG. 19, the terminals 1004 of the connector 1003 are set on those of the main circuit boards 1001 and 1002, being electrically connected by means of soldering and so on.

Figure 21:
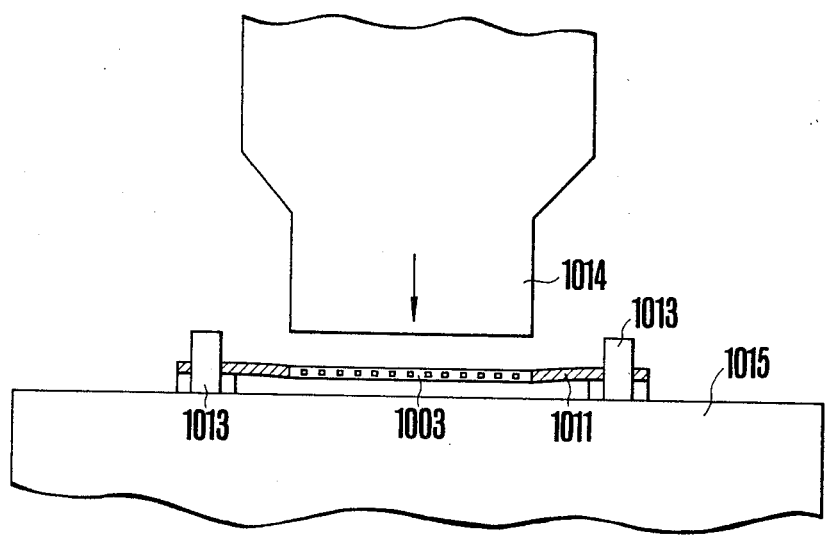
FIG. 21 shows the connecting tool for electrically connecting the terminals of the circuit boards with the terminals of the electrical connector.

FIG. 21 shows the electrically connecting means of the terminals of the main circuit boards 1001 and 1002 to those of the connector. 1015 is the position determining means, 1013 the position determining pin provided on the position determining means and 1014 the connecting means, whereby the terminals 1004 of the connector 1003 are connected to the conductor parts of the main circuit boards by means of soldering and so on into one unity.

Figure 22:
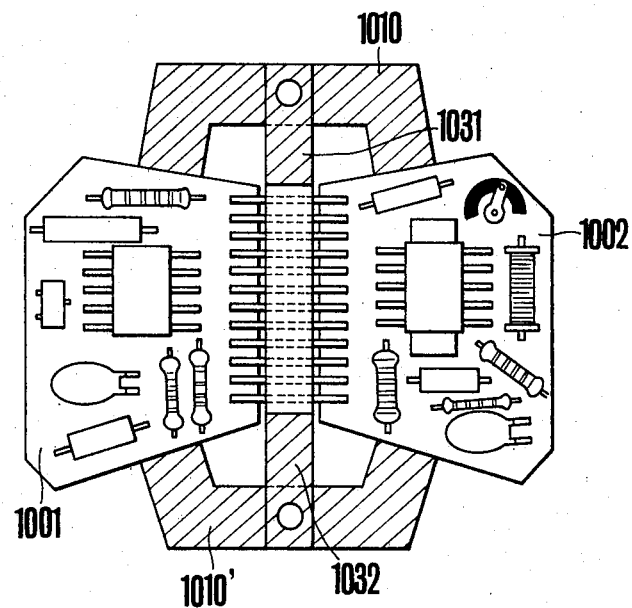
FIG. 22 shows the main circuit boards and the connector electrically connected to each other.
Figure 23:
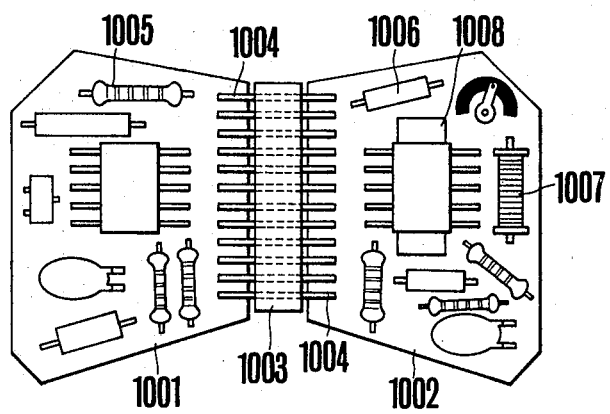
FIG. 23 shows the main circuit boards and the connector whereby the mechanical connecting part is eliminated.

FIG. 22 shows the main circuit boards 1001 and 1002, on which the electrical circuit composing elements are provided, wired and connected to each other by means of the connector. At a subsequent time, the connecting parts 1010 and 1010′ of the main circuit boards and the prolongations 1031 and 1032 of the connector may be removed by corresponding means as is shown in FIG. 23.

As explained above, in accordance with the present invention, by connecting a plural number of the main circuit boards on which the wirings are printed and the electrical circuit composing members are arranged, by means of the connecting means, the main circuit boards and the wiring plates can easily be connected to each other so as to increase the accuracy of the electrical connection.

Below, the method in accordance with the present invention for connecting the main circuit boards with the flexible wiring circuit and for arranging them in a camera will be explained.

Figure 24:
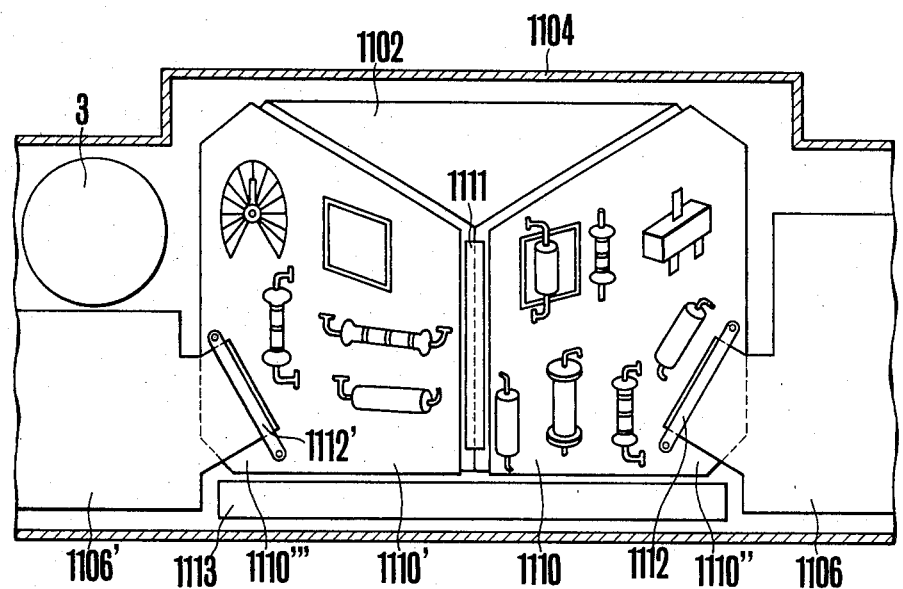
FIGS. 24 and 26 show an upper and side view respectively of the mechanical integration of the main circuit boards in accordance with the present invention with the flexible wiring circuit in the camera.

FIG. 24 shows an embodiment of the present invention, whereby the main circuit boards arranged in the space surrounded with the upper cover of the camera, the pentagonal prism and the mechanical part are divided at proper positions and composed as one body. In the drawing, 1113 is the space in the camera for containing the eye piece and so on, 1110 and 1110′ are the plural numbers of the main circuit boards provided in the space between the non-functioning part of the pentagonal prism 1102 and the upper cover 1104. 1110″ and 1110‴ are the feet of the boards 1110 and 1110′ on the pentagonal prism.

1111 is the joint or the connector for electrically connecting the main circuit boards 1110 and 1110′ to each other at the upper edge of the pentagonal prism 1102. By constituting this joint or the connector with a flexible member, the main circuit boards 1110 and 1110′ can be treated as one even board at the time of assembling and adjusting in such a manner that these boards can be arranged on the surface of the pentagonal prism.

1112 and 1112′ are the connectors for connecting the main circuit board 1110 to the flexible wiring circuit 1106 or the main circuit board 1110′ to the flexible wiring circuit 1106′ at the foot of the pentagonal prism. In accordance with the present invention, the circuit boards provided in the space surrounded with the upper cover of the camera, the pentagonal prism parts and the mechanical parts of the camera are arranged, being divided, along the edge of the pentagonal prism, connected by means of the electrical connecting means at the edge of the pentagonal prism. Each of the main circuit boards is connected with flexible wiring circuit by means of electrical connecting means at the foot of the pentagonal prism in such a manner that the circuit board divided into plural numbers is electrically composed as one body.

Figure 25:
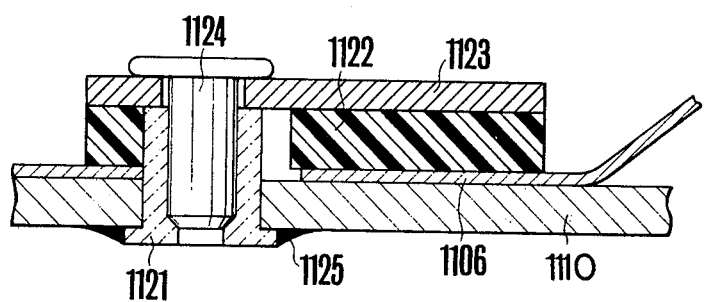
FIG. 25 shows the connecting part of the circuit board with the flexible wiring circuit in enlargement.
Figure 26:
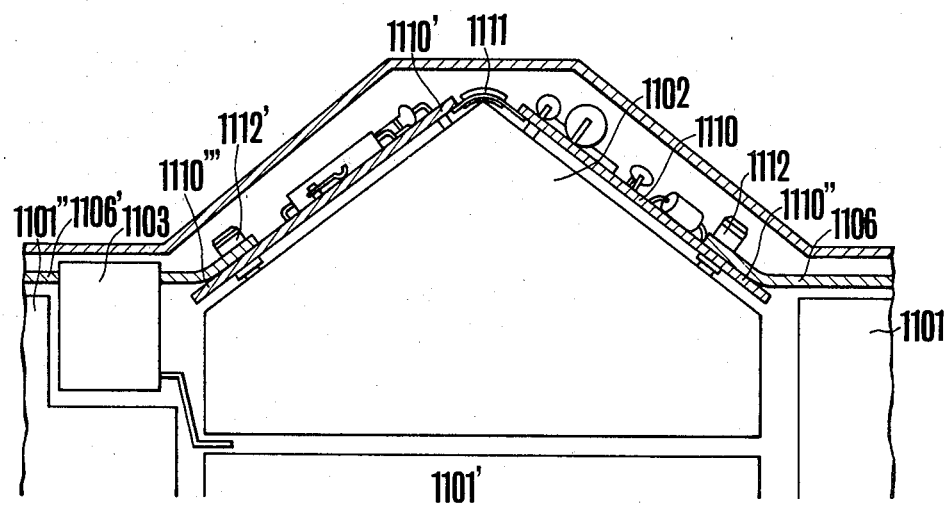

FIG. 26 shows the main circuit boards 1110, (1110′) provided at the foot of the pentagonal prism and the flexible wiring circuits 1106, (1106′) provided in the space between the upper cover of the camera and the mechanical part 1101, (1101′), whereby the circuit plates and the wiring plates are connected respectively by means of the connector 1112, (1112′). Element 1121, as shown in FIG. 25, is a dowel with screw inside for positioning the electrical contact member of the flexible wiring circuit 1106 over those of the circuit board 1110, pressing them with the elastic member 1122 and the press member 1123 and securing them with the screw 1124.

The dowel 1121, the elastic member 1122, the press member 1123, and the screw part 1124 constitute the connector 1112, 1112′ in FIG. 24.

In the case of the present embodiment, the dowel 1121 is fixed on the main circuit board 1110 with soldering 1125 so as to obtain the increase of the efficiency at the time of mechanical integration and disintegration.

Below, the character of the pattern constituting the main circuit board of the camera in accordance with the present invention shown in FIGS. 9 and 10 and that of the special pattern of the sub-circuit board shown in FIG. 12 will be explained.

1. Ladder-shaped pattern: This pattern is provided in the form of a ladder as parts to be trimmed so as to finely adjust the resistance of each resistor element consisting of a resistance layer in parallel with a part of the resistor element, whereby each step of the ladder is trimmed from the bottom by means of laser light so as to alter the resistance value. In this way, the current to run through the trimming part runs through the remaining steps untrimmed while no current runs through the steps trimmed so that even after the trimming, the resistance value is very stable, not changing with age and not producing any noise. The resistance value to be finely adjusted at the ladder-shaped trimming part is of step so that it is possible to carry out all of the more precise fine adjustments together with the conventional method to trim the foot of the thick line shaped pattern. The above-mentioned trimming by means of the laser light can be carried out only after coating the board so that there is no danger that the material vaporized by means of the laser light should soil other than mechanical parts and, therefore, the alteration of the constant due to the trimming operation of the board never takes place. Further, the trimming can be carried out after IC and other external members have been mounted on the board so that the number of the semi-fixed type trimmer resistors and so on which are essential for the conventional construction for absorbing the irregularity of the optical system, IC and so on can be reduced remarkably in such a manner that not only the space can be economized but also the cost can be reduced. Further, it is possible to increase the preciseness of the products while the amount of precision of the soldered position can be remarkably reduced so that products with high reliability can effectively be produced on mass production.

2. Variable resistor for high speed sliding brush on the contact: In order to constitute this resistor, the whole circuit pattern is composed with conductor in such a manner that in accordance with the method shown in FIGS. 4 and 5, the board is made even and then the conductor is partially removed by means of selective etching so as to constitute the resistor element parts and, therefore, without producing any change in the resistance value, the adjacent contact portions can be made substantially even with the insulation support slide resistor for high speed sliding brush can be obtained with low cost, whereby the variable resistor for high speed operation in determination of aperture value is obtained with little mechanic-electric chattering noise.

3. Variable resistor for high precision positioning: By providing the brush positioning electrodes necessary for the slide resistor, the high precision positioning can be carried out electrically in such a manner that in comparison with the conventional visual positioning, the number of adjusting processes can remarkably be decreased.

4. Two surface constructions on the main circuit board: The conductor material and the resistance material on the front board as well as the conductor material on the rear surface of the board can be separated from each other with insulating support so that the external members can be arranged on the conductor pattern and the pattern on the front surface and that on the rear surface can be connected to each other by means of the through-holes, whereby the alteration of the resistance value due to the heat produced at soldering onto the board can be eliminated. As for soldering, the dip-flow soldering method can be used so as to be able to increase the operation efficiency.

5. Semi-fixed-type trimmer: On the main circuit boards in accordance with the present invention, resistance layer portions of the semi-fixed-type trimmer resistors can be constituted without any substantial increase in thickness by means of the combination of the resistance layer with the conductor layer. Further, as shown with the above-mentioned patterns, the arrangement of the contacts of the semi-fixed-type trimmer resistor and that of the resistor elements can be made properly so as to economize the space. Further, not only is it possible to increase the number of the contacts by combining the resistance elements accordingly but, also, it is possible to decrease the number of conductors so as to make use of the space to be occupied with the resistance elements effectively. Further, various kinds of variable resistors with 1/X characteristics can easily be constituted.

6. Variable resistor with click operation: By composing the contact electrodes constituting the variable resistor higher than other portions of the board, the click effect can be given to the operation of the brush movable sliding over the contacts. In this way, the phase of the pattern can exactly coincide with that of the click so as to provide many dividing numbers for variable resistor, whereby it is not necessary to provide any separate click mechanism, which is profitable in view of the space, the cost and reliability.

As explained above, in the case of the camera in accordance with the present invention, the main parts of the complicated electrical circuit construction is composed of the main circuit board and the sub-circuit consisting of resistor-conductor laminated construction, whereby they are connected to each other by means of the flexible wiring circuit or electric connector into one construction, while the main circuit boards can be provided along the roof planes of the pentagonal prism so that an electrical circuit construction with high reliability for a camera can be produced at low cost. Thus, a compact and high precision camera electrically controlled can be produced.

What is claimed is:

1. An electrical circuit construction for a camera of the type having an exposure control mechanism and an optical means having a flat, non-functional surface, the construction comprising:

a resistor-conductor laminated electrical circuit arrangement which includes at least one main circuit board which is flatly shaped and forming an essential part of the electrical circuitry positioned on the non-functional surface, and a sub-circuit board for forming a variable electrical circuit element cooperating with an exposure value setting mechanism of the camera, said main circuit and sub-circuit boards being connected to each other by means of flexible printed wiring boards;

each main circuit board and said sub-circuit board being a lamination of multi-layers laminated on an insulating baseboard and which layers are arranged in the order of, first, a resistor layer and, then, a conductor layer; the main circuit board being provided with circuit patterns which are formed by the resistor layer and a combination of the conductor and resistor layers and are to be put on said non-functional surface, said resistor layer being arranged to form resistor elements, laminated parts consisting of the combination of the conductor and resistor layers being used to form conductive parts such as wiring and terminals; the main circuit board having a conductive patterned circuit layer on the opposite side of the combination of the conductor and resistor layer, the circuit layer being electrically connected to said conductive parts through the insulating baseboard;

the conductive patterned circuit layer comprising a terminal pattern, to which semiconductor integrated circuit elements are to be connected, which constitutes said essential part of the electrical circuitry mounted on said main circuit board, each terminal of the integrated circuit elements being soldered and secured directly to the corresponding terminal of the pattern of said conductive patterned circuit layer; and at least one semi-fixed adjustable resistor being provided at said resistor element formed by said resistor layer of said main circuit board for the purpose of adjusting the resistance value of said resistor element, said resistor having an adjustable member, by which the resistance of the resistor is adjustable, being extended through a hole of said insulating baseboard so as to be adjusted.

2. The electrical circuit construction according to claim 1, wherein said main circuit board has a hole in which a portion of the semiconductor integrated circuit element is mounted, so that accommodation space is afforded for other electrical parts to be connected on the terminal of pattern, based upon protrusion of the rest portion of the integrated circuit element on the conductive layer of the main circuit board.

3. The electrical circuit construction according to claim 1, wherein a pair of main circuit boards is provided, which pair is connected through a flexible wiring board.

4. The electrical circuit construction according to claim 1, wherein at least one portion of said circuit pattern which is formed by a combination of the conductor and resistor layers is formed as a trimming part, at least part of the conductor or resistor layers being trimmed for adjusting the resistance value of said resistor element formed by the resistor layer.

5. The electrical circuit construction according to claim 1, wherein said semi-fixed resistor has a fixed part composed of each resistor element which is formed by said resistor layer of each circuit board consisting of said resistor-conductor lamination and a contact which is formed by said conductive part; and said semi-fixed resistor being arranged to perform resistance value adjustment by bringing the contact of the moving part and the contact formed by said conductive part into contact with each other.

6. The electrical circuit construction according to claim 1, wherein said variable electrical circuit element comprises a movable brush slide and fixed contacts provided on said sub-circuit boards made from said resistor-conductor laminations, which is formed to protrude from the surfaces of said circuit boards in such a manner that, when said brush slides over the contacts, the brush makes a clicking action.

7. The electrical circuit construction according to claim 1, wherein said semi-fixed resistor has a variable characteristic of $1/X$.

8. In a method of making an electrical circuit arrangement which has an even surface, comprising the steps of:
providing a circuit board which comprises an insulating baseboard resistor layer deposited on the baseboard and conductor layer deposited on the resistor layer;
forming a concave portion by removing the unnecessary portion of the laminated combination of the conductor layer and resistor layer; and
filling an insulating material into said concave portion and making an even surface between the conductor layer and the insulating material; and
forming a circuit pattern by selectively removing the conductor layer.

9. An electrical component for a variable resistor comprising:
(a) an insulating baseboard member;
(b) a number of fixed electrodes juxtaposed to each other with a predetermined pattern relation, on which a brush slide is selectively movable; and
(c) a resistor layer deposited on said baseboard member, the resistive layer having a predetermined shape for forming a plurality of resistance elements juxtaposed at both sides of said fixed electrodes and connected to said fixed electrodes in a manner such that each two successive electrodes are connected to one resistance element on one side and one on the other side.

10. The electrical component according to claim 9, wherein a resistive layer is deposited on said baseboard member, on which, on the resistive layer, said fixed electrodes are deposited, and said resistance elements are formed by the resistive layer.

11. An electrical component according to claim 9, which further comprises trimming means provided on the board member, the trimming means consisting of a predetermined shaped combination of conductor layer and resistor layer which is connected to one of the fixed electrodes for adjusting the resistance characteristic of the component finely by removal of at least one of the conductor layers.

12. An electrical component according to claim 9, which further comprises a number of filling members, each of which is provided between the adjacent fixed electrodes for flattening a surface formed by the conductor parts and the filling members for facilitating a sliding operation thereon.

13. An electrical component for a variable or semi-fixed resistor comprising:
(a) an insulating baseboard member;
(b) a resistor layer provided on the board member;
(c) juxtaposed fixed electrodes provided on the resistor layer, each electrode having a meandering portion deposited on the resistor layer outside an electrode portion, each of which is juxtaposed in parallel; and
(d) a part of each meandering portion being removed so as to form a resistance element, which is adapted to be used for the variable or semi-fixed resistor.

14. The electrical component according to claim 13, wherein said resistance element is formed at both sides of the fixed electrodes in a manner that each adjacent electrode is connected to a resistance element positioned at different sides of the electrode.

15. An electrical component comprising:
(a) a baseboard member of electrically insulating material;
(b) a number n of juxtaposed resistor elements of electrically resistive material positioned on the board member, where n is a positive integer not less than two, each element having a predetermined resistance value and connected to each other in parallel; and
(c) each of a selective number k of the resistor elements having a partially resistive material removed portion for stepwisely obtaining the combined resistance value of the resistor elements in parallel.

16. The electrical component according to claim 15, which further comprises a predetermined shaped resistor element having a given surface area, the element connected electrically to said parallelly connected resistor elements, and wherein the surface area has a trimmed portion for finely obtaining the total resistance value of the parallelly connected resistor elements and the predetermined shaped resistor element.

17. An electrical component for an integrated circuit assembly comprising:
(a) an insulating base substrate;
(b) a first printed circuit having a predetermined circuit pattern comprising a plurality of resistors and conductors, each resistor being formed by removing the following (1) layer partially and (2) layer and conductor being formed by partially removing the following (1), (2) layers: where layer (1) and (2) are
(1) a first resistor layer deposited on a surface of the substrate; and
(2) a first conductive layer deposited on the resistor layer;
(c) a second printed circuit having a predetermined circuit pattern comprising a plurality of resistors and conductors having terminal conductors to be connected to an integrated circuit unit, each resistor being formed by removing the following (3) layer partially and (4) layer and the conductor being formed by partially removing the following (3), (4) layers: where layers (3) and (4) are
(3) a second resistor layer deposited on the other surface of the substrate; and
(4) a second conductive layer deposited on the second resistive layer;
(d) said resistor comprising an adjustable or semi-fixed resistor provided on the substrate; and
(e) connector means arranged to be positioned in the baseboard for electrically connecting between the conductor of the first printed circuit and the conductor of the second printed circuit.

18. A variable resistor comprising:
(a) a hard baseboard;
(b) a resistor layer deposited on the baseboard;
(c) a conductive layer deposited on the resistor layer;
(d) a number of resistor portions formed by removing corresponding parts of the conductive layer based on a predetermined pattern to be formed by the resistor portions and a number of recesses to be formed by removing at least a part of the conductive layer and the resistor layer, a part of the remaining conductive layer being arranged to form a number of fixed electrodes, each two successive electrodes having one of said recesses therebetween; and
(e) a sliding contact for sliding on the electrodes and engaging with the recess formed by the juxtaposed electrodes so as to cause a click action by the recess.

19. A circuit board adapted for a printed circuit comprising:
(a) a first circuit board having a surface on which the printed circuit is to be formed;
(b) a second circuit board having a surface on which the other printed circuit is to be formed;
(c) a connecting part for connecting the first circuit board with the second circuit board in a predetermined positional relation; and
(d) the connecting part having an alignment recess for aligning a sub-connecting board which has a connecting wire terminal so as to connect electrically between the printed circuits on the first circuit board and the second circuit board, with the first and second circuit boards in a manner that the terminal of the sub-connecting board is positioned at the corresponding counterpart of the printed circuits on the first and second circuit boards.

20. The circuit board according to claim 19, wherein the first and second circuit boards are connected by two connecting parts formed by the same material as the circuit board in one body, each connecting part having a hole as the recess for aligning.

21. A method for connecting electrically between two circuit boards comprising the following steps:
(a) providing a circuit board having a first circuit board portion, a second circuit board portion and a connecting portion connecting both board portions in one body, the connecting portion having a positional alignment part;
(b) providing a connecting board which has a terminal wiring for connecting between the circuits to be formed on the first and second board portions, the connecting board having a corresponding positional alignment part to the alignment part of the connecting portion;
(c) aligning the connecting board in relation to the circuit board by each alignment part provided at the connecting board and the circuit board respectively;
(d) connecting electrically between the wiring terminal and the circuit on the first and second boards; and
(e) removing the connecting portion.

* * * * *